United States Patent
Fuma et al.

(10) Patent No.: US 10,281,124 B2
(45) Date of Patent: May 7, 2019

(54) ELECTRONIC DEVICE AND LIGHTING APPARATUS

(71) Applicant: MINEBEA MITSUMI INC., Kitasaku-gun, Nagano (JP)

(72) Inventors: Hidenori Fuma, Tokorozawa (JP); Nobuki Matsui, Saitama (JP)

(73) Assignee: MINEBEA MITSUMI INC., Nagano (JP)

( * ) Notice: Subject to any disclaimer, the term of this patent is extended or adjusted under 35 U.S.C. 154(b) by 11 days.

(21) Appl. No.: 15/490,133

(22) Filed: Apr. 18, 2017

(65) Prior Publication Data

US 2017/0307194 A1 Oct. 26, 2017

(30) Foreign Application Priority Data

Apr. 22, 2016 (JP) ................. 2016-086353

(51) Int. Cl.
| | | |
|---|---|---|
| *F21V 17/10* | (2006.01) | |
| *F21V 21/15* | (2006.01) | |
| *F21V 29/76* | (2015.01) | |
| *F21V 3/00* | (2015.01) | |
| *F21V 7/00* | (2006.01) | |
| *F21V 15/01* | (2006.01) | |
| *F21V 17/02* | (2006.01) | |
| *F21V 21/26* | (2006.01) | |
| *H01L 33/64* | (2010.01) | |

(52) U.S. Cl.
CPC ............... *F21V 21/15* (2013.01); *F21V 3/00* (2013.01); *F21V 7/00* (2013.01); *F21V 15/01* (2013.01); *F21V 17/02* (2013.01); *F21V 21/26* (2013.01); *F21V 29/76* (2015.01); *H01L 33/64* (2013.01)

(58) Field of Classification Search
CPC ...... F21K 21/0808; F21K 9/237; F21V 21/15; F21V 17/02; G02F 1/1333
See application file for complete search history.

(56) References Cited

U.S. PATENT DOCUMENTS

| 9,255,702 B2 | 2/2016 | Singer et al. | |
|---|---|---|---|
| 2014/0240994 A1* | 8/2014 | Lim | .............. F21V 3/0625 362/382 |
| 2015/0016136 A1* | 1/2015 | Nakano | .............. F21S 48/212 362/520 |

FOREIGN PATENT DOCUMENTS

| DE | 102010033092 A1 | 2/2012 |
|---|---|---|
| JP | 2005-101259 A | 4/2005 |
| JP | 2006-196576 A | 7/2006 |
| JP | 2013-247062 A | 12/2013 |
| JP | 2014-120446 A | 6/2014 |
| JP | 2015-197574 A | 11/2015 |

(Continued)

OTHER PUBLICATIONS

Feb. 27, 2018 Office Action issued in Japanese Patent Application No. 2016-086353.

(Continued)

*Primary Examiner* — Karabi Guharay
(74) *Attorney, Agent, or Firm* — Oliff PLC

(57) ABSTRACT

An electronic device according to an embodiment includes an electronic component and equipment. The equipment includes a mounting surface on which the electronic component is mounted via a coating agent and on which a recessed portion is provided along a part of a circumferential end portion of the electronic component.

13 Claims, 20 Drawing Sheets

(56) References Cited

FOREIGN PATENT DOCUMENTS

| | | |
|---|---|---|
| JP | 2016-54249 A | 4/2016 |
| KR | 101103525 B1 | 1/2012 |

OTHER PUBLICATIONS

Jul. 26, 2017 Extended Search Report issued in European Patent Application No. 17167382.5.

* cited by examiner

ELECTRONIC DEVICE AND LIGHTING APPARATUS

CROSS-REFERENCE TO RELATED APPLICATION(S)

The present application claims priority to and incorporates by reference the entire contents of Japanese Patent Application No. 2016-086353 filed in Japan on Apr. 22, 2016.

BACKGROUND OF THE INVENTION

1. Field of the Invention

The present invention relates to an electronic device and to a lighting apparatus provided therewith.

2. Description of the Related Art

Conventionally, provided has been an electronic device that mounts an electronic component on equipment by applying a coating agent such as grease of high thermal conductivity between the electronic component and a mounting surface of the equipment. Such an electronic device includes a lighting fixture or the like that mounts a light source as an electronic component, on a heat sink as equipment. For example, in order to appropriately mount the electronic component on the equipment via the grease, a recessed portion (groove) as a coating agent reservoir may be provided on the mounting surface of the equipment. Related-art examples are described in Japanese Laid-open Patent Publication No. 2015-197574 and Japanese Laid-open Patent Publication No. 2013-247062.

In the conventional technology, however, it is difficult to make it possible to appropriately mount the electronic component on the equipment. For example, in the above-described electronic device, when the recessed portion is provided over the whole circumference of a mounting place of the electronic component on the mounting surface of the equipment, it is difficult to make it possible to appropriately mount the electronic component on the equipment due to an increase in machining time of the equipment, reduction in heat dissipation by a decrease in contact area between the electronic component and the equipment, or other reasons.

An object of the present invention is to provide an electronic device that makes it possible to appropriately mount an electronic component on equipment, and a lighting apparatus that is provided therewith.

SUMMARY OF THE INVENTION

It is an object of the present invention to at least partially solve the problems in the conventional technology.

An electronic device according to an embodiment includes an electronic component and equipment. The equipment includes a mounting surface on which the electronic component is mounted via a coating agent and on which a recessed portion is provided along a part of a circumferential end portion of the electronic component.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENT

Figure 1:
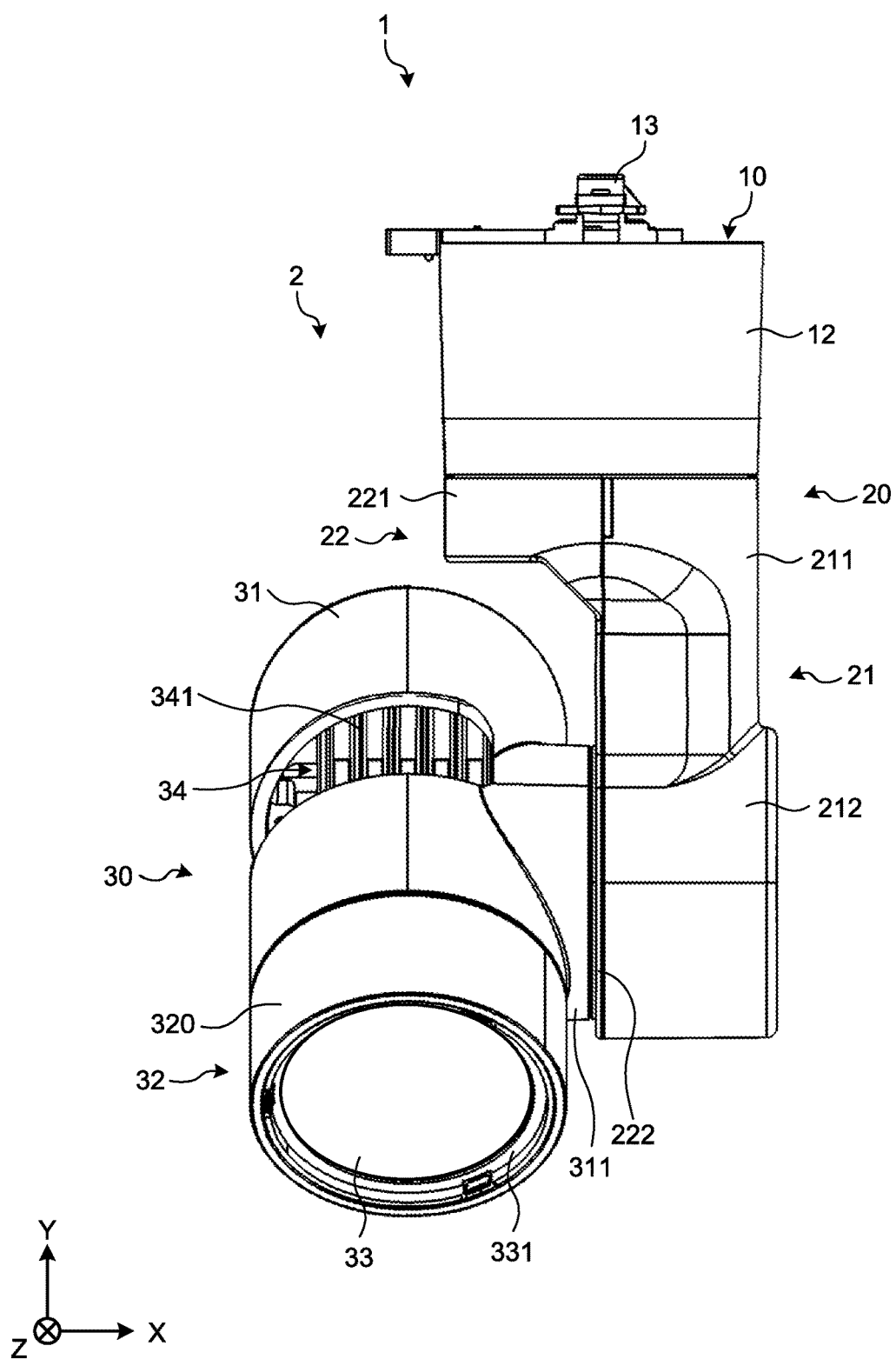
FIG. 1 is a front view illustrating a lighting apparatus according to an embodiment.

In the following embodiment, a lighting apparatus 1 as one example of an apparatus including an electronic device 2 will be described with reference to the accompanying drawings. Exemplified is a situation that the electronic device 2 in the embodiment includes a substrate 100 and a light emitting element 101 (see FIG. 16) as an electronic component, and includes a heat dissipation unit 34 (see FIG. 9) that is a heat sink as equipment. The purpose of the electronic device 2, however, is not intended to be limited by the embodiment described in the following. The electronic device 2 may be applied to, not limited to the lighting apparatus 1, any apparatuses in accordance with the purpose, as long as being in a configuration that mounts an electronic component on a mounting surface of equipment. For example, the electronic device 2 may be used in an apparatus that has a camera function by such as an imaging element as an electronic component. Furthermore, it is necessary to note that the drawings are schematic and that the relation of dimensions of respective elements, the ratios of the respective elements, and the like may be different from the reality. Between the drawings also, portions that the relation of dimensions and the ratios are different from one another may be included.

Embodiment

Figure 2:
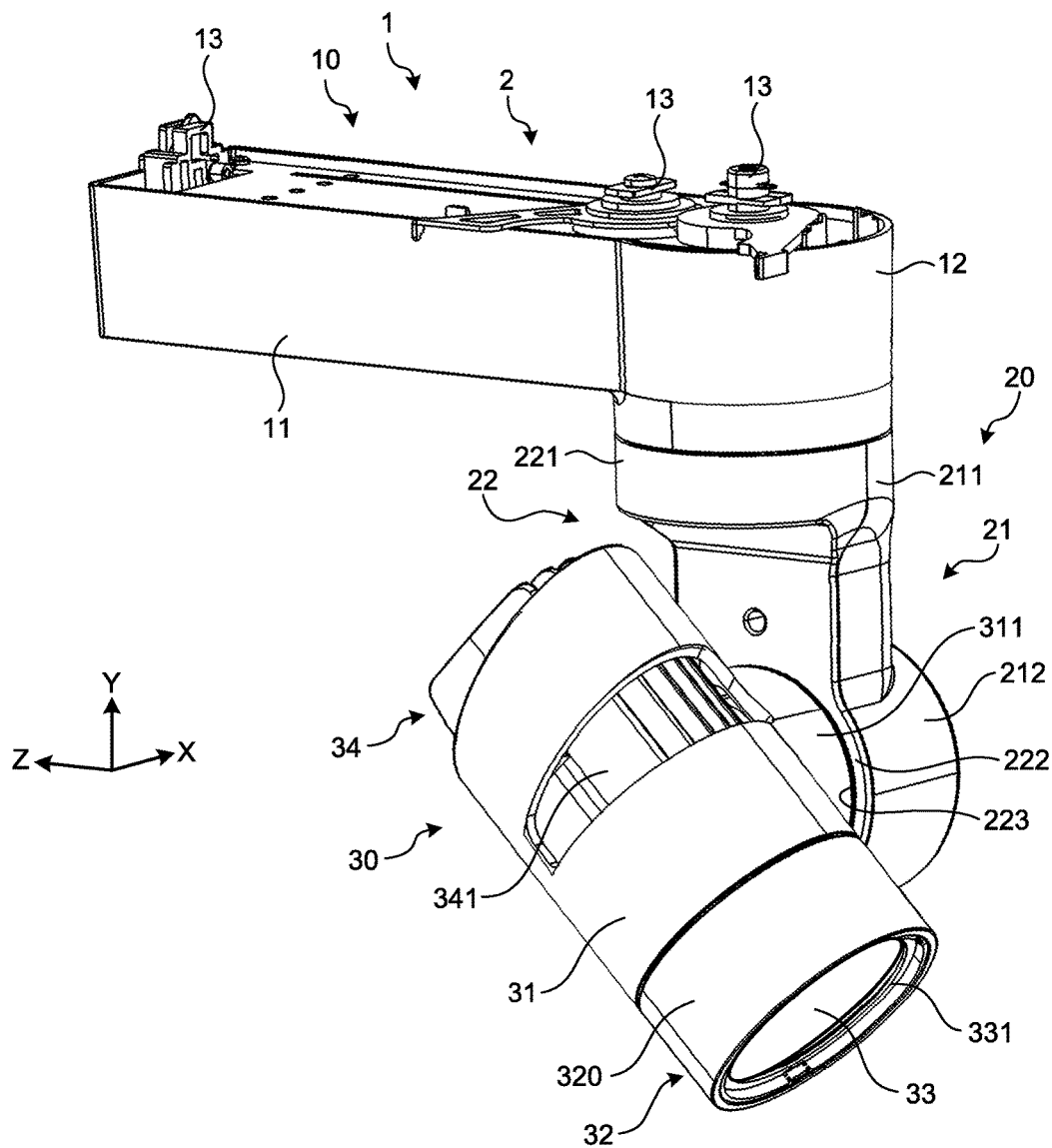
FIG. 2 is a perspective view illustrating the lighting apparatus in the embodiment.

First, with reference to FIGS. 1 and 2, an overview of the configuration of the lighting apparatus 1 will be described. FIG. 1 is a front view of the lighting apparatus 1. FIG. 2 is a perspective view of the lighting apparatus 1 viewed from a light source unit 30 side.

In the following description, the direction along the rotation axis (hereinafter also referred to as "first rotation axis") of an arm portion 20 which will be described later is defined as a Y axis, and an X axis and a Z axis are defined as axes that are orthogonal within a plane orthogonal to the Y axis. For example, the X axis is the direction along the rotation axis (hereinafter also referred to as "second rotation axis") of the light source unit 30 in the position (initial position) at the time of installing the lighting apparatus 1.

The lighting apparatus 1 is provided with the electronic device 2 including a supporting portion 10, the arm portion 20, and the light source unit 30.

Figure 3:
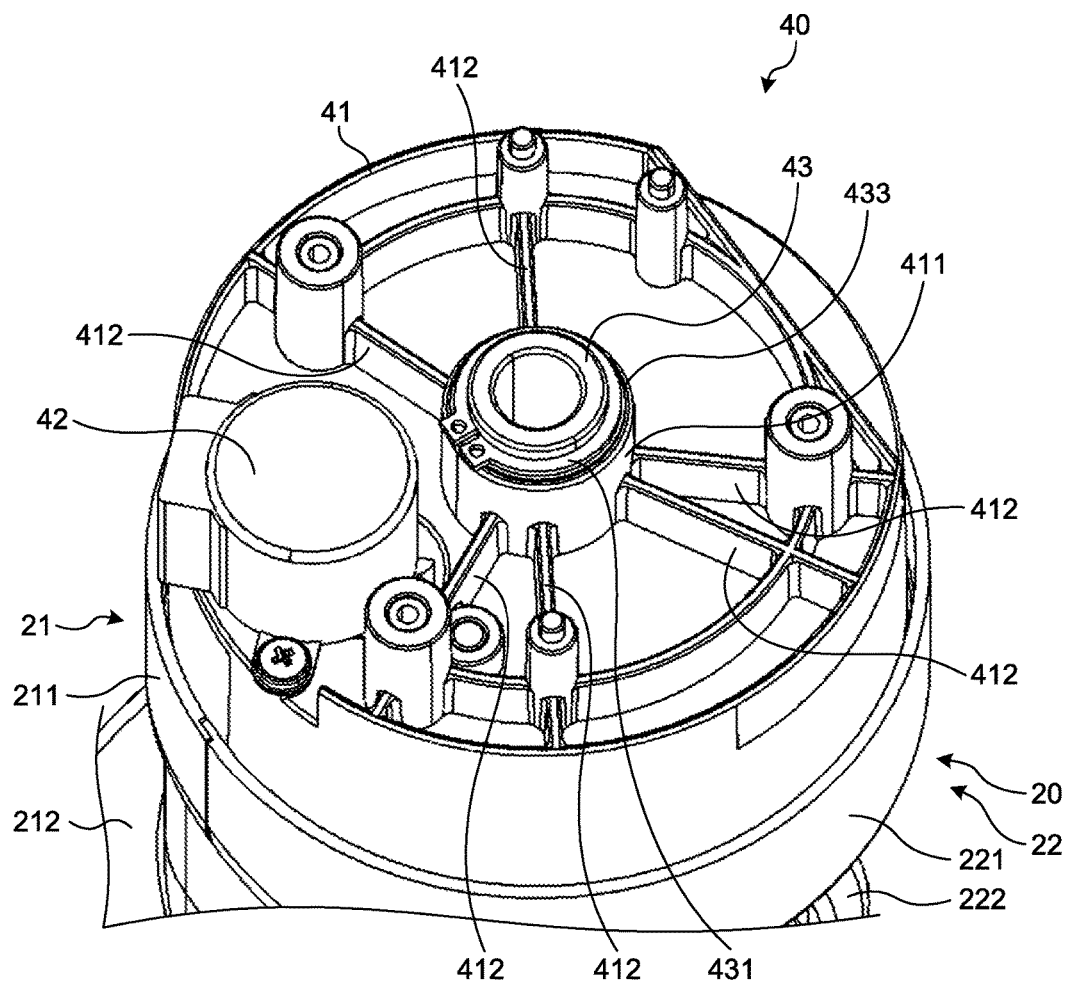
FIG. 3 is a perspective view illustrating a principal part of a supporting portion of the lighting apparatus in the embodiment.

The supporting portion 10 includes a rectangular box-like housing portion 11, a cylindrical coupling portion 12, and a first rotating portion 40 (see FIG. 3). For example, the supporting portion 10 may be formed of any material, and may be formed of, for example, aluminum.

In the supporting portion 10, a power supply device (depiction omitted) that supplies electrical power to a first motor 42, a second motor 56, a light emitting element 101, and others is housed in the housing portion 11. The supporting portion 10 is mounted on a certain object (structural object) such as a ceiling, by locking portions 13 that are provided on one surface of the housing portion 11. For example, the supporting portion 10 is, by the locking portions 13, detachably mounted on an intended position of a rail (depiction omitted) provided on a ceiling surface.

In the following description, a positive direction of the Y axis is defined as an upward direction, a negative direction of the Y axis is defined as a downward direction, and the direction orthogonal to the Y axis is defined as the horizontal direction. In this case, the negative direction of the Y axis is the direction of gravity and the plane orthogonal to the Y axis is a horizontal plane. While three locking portions 13 are illustrated in FIG. 2, as long as it is possible to mount the lighting apparatus 1 on a certain object, the number of the locking portions 13 may be any number and the locking portions 13 may be in any shape. In the example in FIGS. 1 and 2, out of the locking portions 13, from the locking portion 13 at the left end in FIG. 2, the electrical power may be supplied to the power supply device inside the housing portion 11.

From one end portion (lower end in FIG. 1) of the coupling portion 12 of the supporting portion 10, the arm portion 20 extends. In the coupling portion 12, the first rotating portion 40 including the first motor 42 is arranged, and by the first rotating portion 40, a reinforced portion 50 (see FIG. 5) provided in the arm portion 20 is pivotally supported. Thus, the supporting portion 10 supports the arm portion 20 in a rotatable manner along the first rotation axis. For example, the first rotating portion 40 is mounted on the coupling portion 12 by a certain mechanism such as fixing screws.

Figure 4:
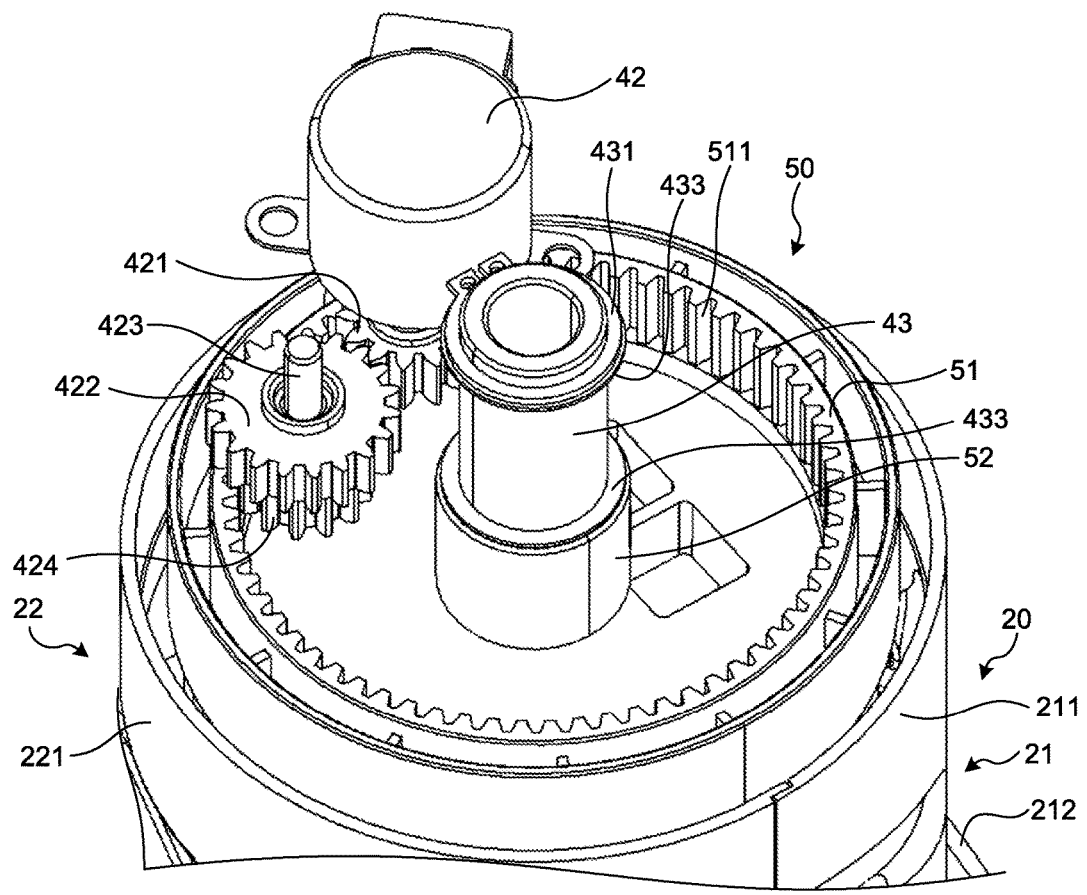
FIG. 4 is a perspective view illustrating a part of a reinforced portion of the lighting apparatus in the embodiment.
Figure 5:
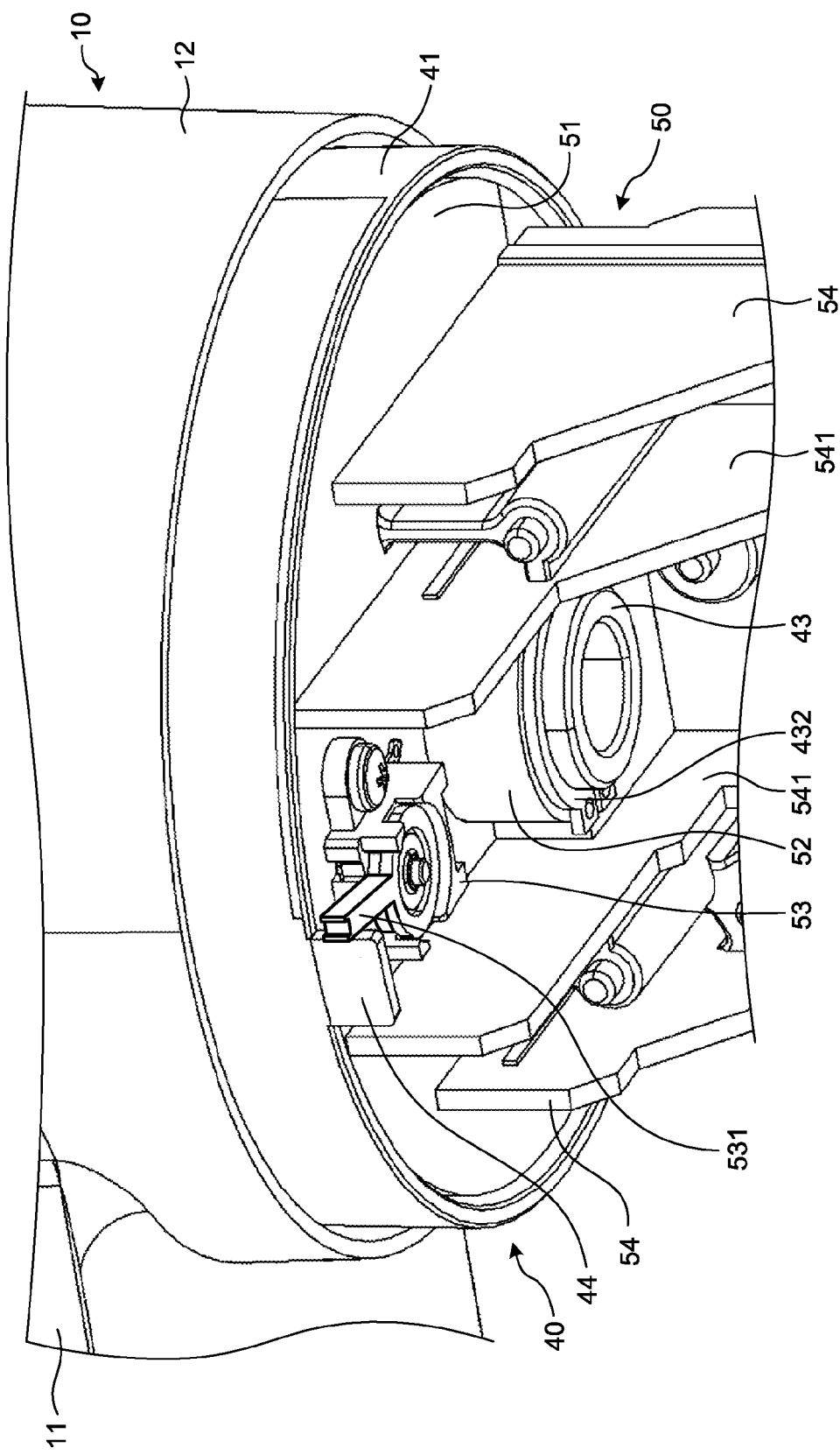
FIG. 5 is a perspective view illustrating a part of the reinforced portion of the lighting apparatus in the embodiment.

With reference to FIGS. 3 to 5, the configuration of the first rotating portion 40 and the relation between the first rotating portion 40 and the reinforced portion 50 will be described. FIG. 3 is a perspective view illustrating a principal part of the supporting portion of the lighting apparatus in the embodiment. Specifically, FIG. 3 is a perspective view that viewed the first rotating portion 40 from the opposite side of the arm portion 20, except for the coupling portion 12 of the supporting portion 10.

The first rotating portion 40 includes a base portion 41 having a cylindrical outer circumferential wall. The central portion of the base portion 41 has a cylindrical insertion hole 411 the axis of which lies along the axis of the base portion 41. The first rotating portion 40 includes a plurality of wall portions 412 radially extending from the insertion hole 411 toward the outer circumferential wall of the base portion 41. The wall portions 412 are provided in an upright manner along the direction of the first rotation axis. With the wall portions 412, the mechanical strength of the first rotating portion 40 is reinforced.

The first rotating portion 40 further includes the first motor 42 serving as a first drive means. The first motor 42 is mounted on the outer circumferential wall of the base portion 41. For example, an output rotating shaft (depiction omitted) of the first motor 42 is inserted into a through hole (depiction omitted) provided on a planar portion of the base portion 41 and protrudes on the opposite side (lower side in FIG. 3). That is, the output rotating shaft of the first motor 42 extends toward the arm portion 20 side and rotates the arm portion 20 about the first rotation axis. For example, for the first motor 42, a stepping motor is used and, by lead wires (depiction omitted) extending from the first motor 42, is connected to a driving circuit 57 (see FIG. 7). The driving circuit 57 may have a wireless communication function such as Bluetooth (registered trademark) and, by the wireless communication function, receive instructions of driving the first motor 42 and the second motor 56 from the outside.

With reference to FIG. 4, the rotation of the arm portion 20 about the first rotation axis will be described. FIG. 4 is a perspective view illustrating a part of the reinforced portion of the lighting apparatus in the embodiment. Specifically, FIG. 4 illustrates a mechanism that transmits a driving force from the first motor 42 to the reinforced portion 50, except for the base portion 41 of the first rotating portion 40.

As illustrated in FIG. 4, on the output rotation shaft of the first motor 42, a gear 421 is mounted. The gear 421 mounted on the output rotation shaft of the first motor 42 meshes with a large-diameter gear 422. On a rotation shaft 423 on which the large-diameter gear 422 is mounted, a small-diameter gear 424 is attached. That is, the large-diameter gear 422 and the small-diameter gear 424 rotate about the rotation shaft 423.

The small-diameter gear 424 further meshes with internal teeth 511 that are included on the inner circumferential surface of one end portion 51 of the reinforced portion 50. Accordingly, in accordance with the output of the first motor 42, the reinforced portion 50 rotates in the horizontal direction about the first rotation axis. Because the reinforced portion 50 is mounted on the inside of the arm portion 20, by the reinforced portion 50 rotating about the first rotation axis, an entirety of the arm portion 20 rotates about the first rotation axis. In the example illustrated in FIG. 4, the internal teeth 511 of the reinforced portion 50 are provided over the whole circumference of the inner circumferential surface of the one end portion 51. The central portion of the one end portion 51 of the reinforced portion 50 includes a cylindrical insertion portion 52, which will be described in detail later.

With reference to FIG. 5, the restriction in the range of rotation of the reinforced portion 50 will be described. FIG. 5 is a perspective view illustrating a part of the reinforced portion of the lighting apparatus in the embodiment. Specifically, FIG. 5 illustrates a mechanism that restricts the rotation about the first rotating axis, except for a later-described first frame 21 and a second frame 22 of the arm portion 20. FIG. 5 illustrates the opposite surface side of the opposing surface to the first rotating portion 40 of the one end portion 51 of the reinforced portion 50.

As illustrated in FIG. 5, on the opposite surface of the opposing surface to the first rotating portion 40 of the one end portion 51, a limit switch 53 is provided. For example, on the opposite surface of the opposing surface to the first rotating portion 40 of the one end portion 51, the limit switch 53 is provided with a lever 531 projecting in the outer circumferential direction of the one end portion 51.

On the end portion of the outer circumferential wall of the base portion 41 of the first rotating portion 40 that is arranged so as to cover the outer circumference wall of the one end portion 51 of the reinforced portion 50, a projecting portion 44 protrudes therefrom. As the lever 531 of the limit switch 53 is rotated by the projecting portion 44 of the first rotating portion 40, the limit in the rotation angle that has been set is thereby detected and is used for motor control such as stopping the operation of the first motor 42. In the present embodiment, it is assumed that the first rotating portion 40 restricts, by the limit switch 53 and the projecting portion 44 of the first rotating portion 40, the rotation angle in a range of approximately 360 degrees in the horizontal direction.

Next, a mechanism that the first rotating portion 40 pivotally supports the reinforced portion 50 will be described. Referring back to FIG. 3, into the insertion hole 411 of the first rotating portion 40, a first shaft 43 is inserted. The first shaft 43 has a retaining mechanism on the end portion in the direction of the first rotation axis. In the example illustrated in FIG. 3, on the end portion of the first shaft 43 that is inserted into the insertion hole 411 of the first rotating portion 40, a C-ring 431 is attached, and by the C-ring 431, the first shaft 43 is prevented from slipping out from the insertion hole 411 of the first rotating portion 40.

As illustrated in FIGS. 4 and 5, the first shaft 43 is further inserted into the insertion portion 52 of the reinforced portion 50. For example, the first shaft 43 is press fitted and secured into the insertion portion 52 of the reinforced portion 50. As just described, the first shaft 43 is press fitted and secured into the insertion portion 52 of the reinforced portion 50, and is fitted in a rotatable manner in the insertion hole 411 of the first rotating portion 40. That is, the first shaft 43 is supported by the insertion hole 411 of the first rotating portion 40 and, in accordance with the drive of the first motor 42, rotates together with the reinforced portion 50.

Furthermore, as illustrated in FIG. 5, on the end portion of the first shaft 43 that is inserted into the insertion portion 52 of the reinforced portion 50, a C-ring 432 is attached, and by the C-ring 432, the first shaft 43 is prevented from slipping out from the insertion portion 52 of the reinforced portion 50. As just described, the first rotating portion 40 pivotally supports the reinforced portion 50 in a manner rotatable about the first rotation axis. As illustrated in FIG. 3, between the insertion hole 411 of the first rotating portion 40 and the C-ring 431, a sliding member 433 is arranged. As illustrated in FIG. 4, between the insertion portion 52 of the reinforced portion 50 and the insertion hole 411 (see FIG. 3) of the first rotating portion 40, the sliding member 433 is arranged. This prevents the friction due to the rotation of the reinforced portion 50 between the first rotating portion 40 and the reinforced portion 50. For example, a washer that reduces various types of friction, such as polyslider (registered trademark), is used for the sliding member 433. For example, the reinforced portion 50 can smoothly rotate with respect to the first rotating portion 40 by the sliding members 433.

Figure 6:
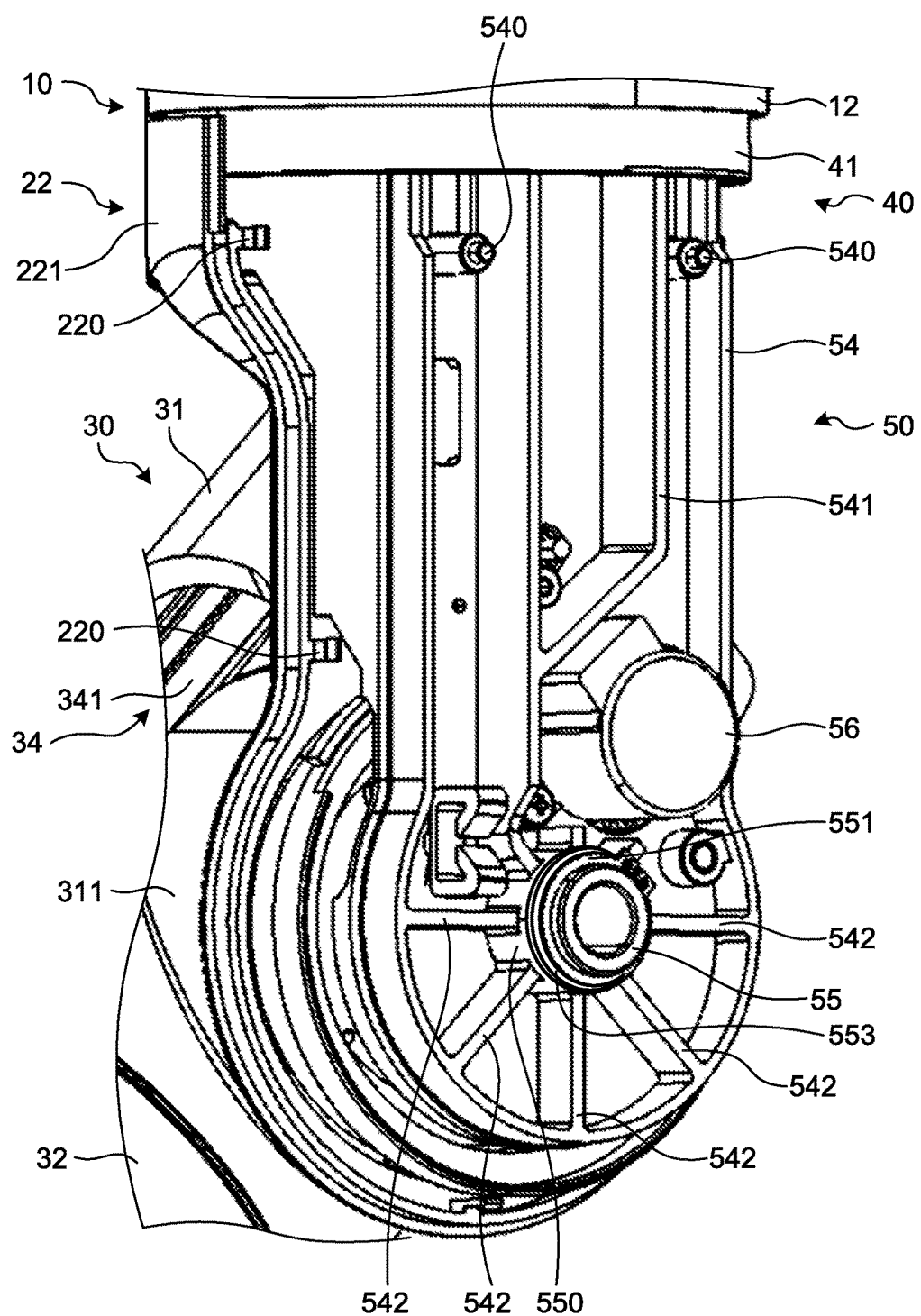
FIG. 6 is a perspective view illustrating the reinforced portion of the lighting apparatus in the embodiment.
Figure 7:
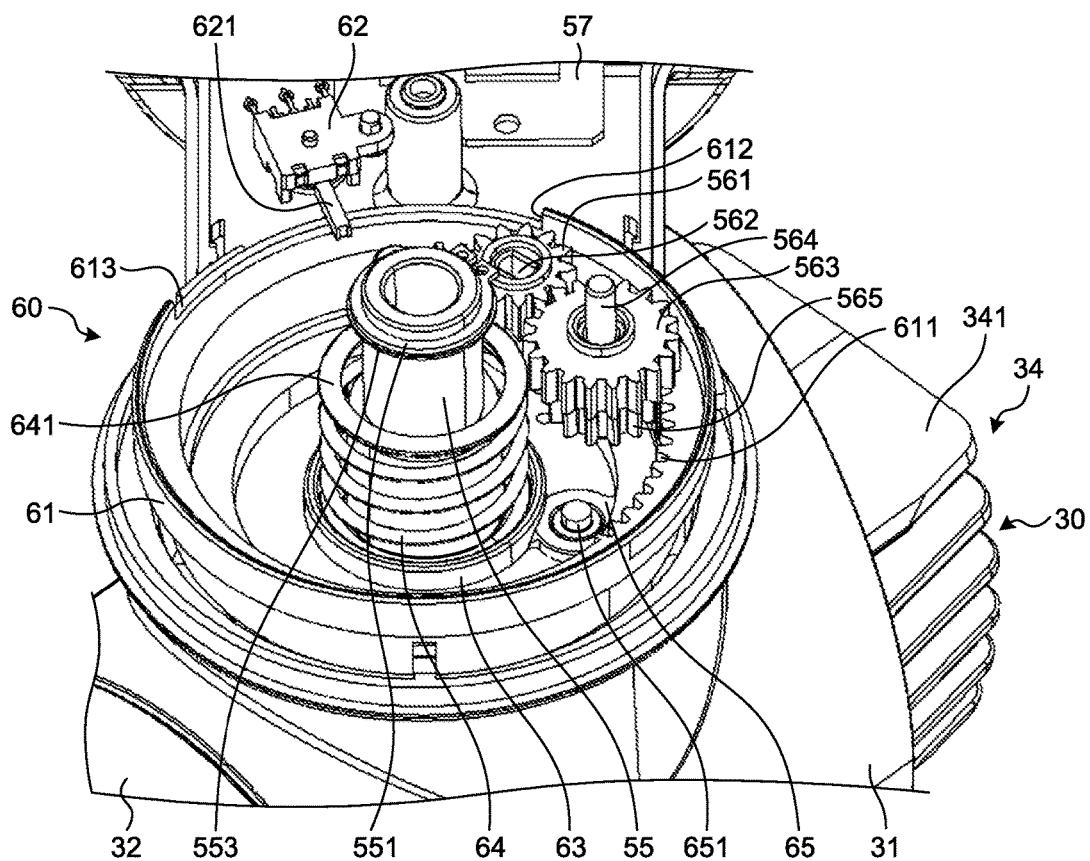
FIG. 7 is a perspective view illustrating a principal part of an arm portion of the lighting apparatus in the embodiment.

As illustrated in FIGS. 2 and 6, the arm portion 20 includes the first frame 21, the second frame 22, the reinforced portion 50, and a second rotating portion 60 (see FIG. 7). FIG. 6 is a perspective view illustrating the reinforced portion of the lighting apparatus in the embodiment. For example, for the arm portion 20, the external form thereof is formed with the first frame 21 and the second frame 22. For example, after housing the reinforced portion 50 and the second rotating portion 60 in the first frame 21, claw portions 220 of the second frame 22 are latched onto locking portions (depiction omitted) of the first frame 21, and the first frame 21 and the second frame 22 thereby form the external form of the arm portion 20. Furthermore, in the arm portion 20, one end portion thereof (one end portion 211 of the first frame 21 and one end portion 221 of the second frame 22) in the extending direction is supported by the supporting portion 10, and the arm portion 20 is rotatable about the first rotation axis by the drive of the first motor 42. For example, as projecting portions 540 (see FIG. 6) of the reinforced portion 50 are inserted into insertion holes (depiction omitted) provided on the one end portion 211 of the first frame 21, the arm portion 20 is supported by the supporting portion 10.

As illustrated in FIG. 1, as compared with the one end portion 221 of the second frame 22, the other portion of the second frame 22 is thinly formed in the left-and-right direction in FIG. 1. Specifically, the width (length in the left-and-right direction in FIG. 1) of the other end portion 222 of the second frame 22 is smaller than the width (length in the left-and-right direction in FIG. 1) of the one end portion 221 of the second frame 22. As just described, by forming the width of the other end portion 222 of the second frame 22 small, it is possible to bring the center of gravity of the light source unit 30, which is supported in a rotatable manner by the arm portion 20, close to the first rotation axis. Accordingly, it is possible to reduce a load on the supporting portion of the light source unit 30 in the arm portion 20, and thus it is possible to prevent the breakage of the lighting apparatus 1.

The arm portion 20 further includes the second motor 56 serving as a second drive means. The arm portion 20 houses the second motor 56 in an area surrounded by the first frame 21 and the second frame 22. For example, as illustrated in FIG. 6, the second motor 56 is mounted on a portion in the reinforced portion 50, the portion being covered with the other end portion 212 (hereinafter also referred to as "other end portion of the reinforced portion 50") of the first frame 21 (see FIG. 2). For example, a output rotating shaft 560 (see FIG. 8) of the second motor 56 is inserted into a through hole (depiction omitted) provided on a planar portion of the other end portion of the reinforced portion 50 and protrudes on the opposite side. That is, the output rotating shaft 560 rotates the light source unit 30 about the second rotation axis that extends toward the direction orthogonal to the first rotating axis. For example, for the second motor 56, a stepping motor is used and, by lead wires (depiction omitted) extending from the second motor 56, is connected to the driving circuit 57 (see FIG. 7).

The reinforced portion 50 is arranged in an area surrounded by the first frame 21 and the second frame 22, and includes an outer circumferential wall 54 having a shape corresponding to the shape of the area surrounded by the first frame 21 and the second frame 22. For example, the outer circumferential wall 54 has a height (length in up-and-down direction in FIG. 1) corresponding to the width (length in left-and-right direction in FIG. 1) of the area surrounded by the first frame 21 and the second frame 22. For example, in planar view from the direction (X axis direction in FIG. 1) along the second rotation axis, in a portion (hereinafter also referred to as "one end portion of the reinforced portion 50") covered with the one end portion 211 of the first frame 21 (see FIG. 2), a pair of outer circumferential walls 54 extends in parallel toward the other end portion side of the reinforced portion 50 and is continuous with the outer circumferential wall 54 in a circular arc shape corresponding to the other end portion of the reinforced portion 50. For example, in planar view from the direction (X axis direction in FIG. 1) along the second rotation axis, between the pair of outer circumferential walls 54 extending from the one end portion of the reinforced portion 50 to the other end portion side of the reinforced portion 50, a wall portion 541 extending along the pair of outer circumferential walls 54 from the one end portion of the reinforced portion 50 to the other end portion side of the reinforced portion 50 is included. The wall portion 541 is provided in an upright manner along the direction of the second rotation axis. This reinforces the mechanical strength of the arm portion 20, and thus makes it possible to prevent the breakage of the lighting apparatus 1.

The central portion of the other end portion of the reinforced portion 50 includes a cylindrical insertion portion 550. The arm portion 20 rotates the light source unit 30 about the second rotation axis that lies along the axis of the insertion portion 550 of the reinforced portion 50, which will be described in detail later. The reinforced portion 50 includes a plurality of wall portions 542 radially extending from the insertion portion 550 toward the outer circumferential wall 54 corresponding to the other end portion of the reinforced portion 50. The wall portions 542 are provided in an upright manner along the direction of the second rotation axis. This reinforces the mechanical strength of the arm portion 20, and thus makes it possible to prevent the breakage of the lighting apparatus 1.

Figure 8:
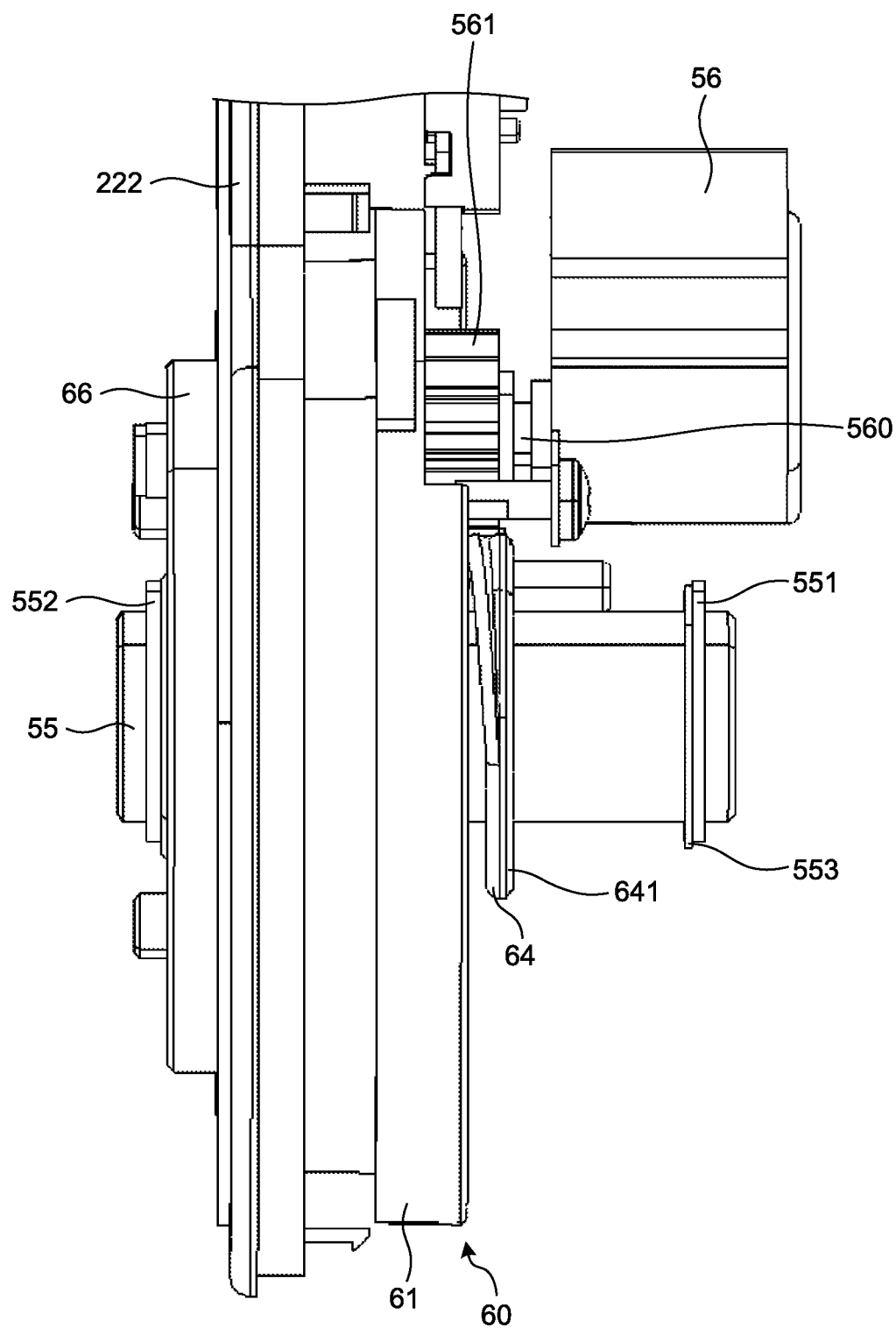
FIG. 8 is a front view illustrating the principal part of the arm portion of the lighting apparatus in the embodiment.

With reference to FIGS. 7 and 8, the configuration of the portion that rotates the light source unit 30 will be described. FIG. 7 is a perspective view illustrating a principal part of the arm portion of the lighting apparatus in the embodiment. FIG. 8 is a front view illustrating the principal part of the arm portion of the lighting apparatus in the embodiment. Specifically, FIGS. 7 and 8 illustrate a mechanism that transmits a driving force from the second motor 56 to the light source unit 30, except for the first frame 21, the outer circumferential walls 54 of the reinforced portion 50, and others.

In the present embodiment, the driving force from the second motor 56 is transmitted to the second rotating portion 60 on which the light source unit 30 is secured by a mechanism such as fixing screws.

The second rotating portion 60 has a base portion 61 having a cylindrical outer circumferential wall. The second rotating portion 60 is retained by the arm portion 20 when a fitting portion 66 that is smaller in diameter than the base portion 61 and is continuous with the base portion 61 is inserted in a rotatable manner into a circular insertion hole 223 (see FIG. 2) provided on the other end portion 222 of the second frame 22.

For example, when a mounting member 651 mounted on the light source unit 30 is mounted on a mounting hole 65 of the second rotating portion 60, the light source unit 30 is secured to the second rotating portion 60. For example, the mounting member 651 may be a screw mechanism with nuts and bolts. That is, the light source unit 30 rotates together with the second rotating portion 60 in accordance with the rotation of the second rotating portion 60. For example, when the second rotating portion 60 rotates about the second rotation axis, the light source unit 30 rotates about the second rotation axis together with the second rotating portion 60. Accordingly, the rotation of the second rotating portion 60 about the second rotation axis will be described.

As illustrated in FIG. 8, on the output rotation shaft 560 of the second motor 56, a gear 561 is mounted. As illustrated in FIG. 7, a shaft insertion hole 562 is provided in the central portion of the gear 561, and when the output rotation shaft 560 of the second motor 56 is inserted into the shaft insertion hole 562 of the gear 561, the gear 561 is attached to the output rotation shaft 560 of the second motor 56. The gear 561 attached to the output rotation shaft 560 of the second motor 56 meshes with a large-diameter gear 563. On a rotation shaft 564 having the large-diameter gear 563 mounted thereon, a small-diameter gear 565 is attached. That is, the large-diameter gear 563 and the small-diameter gear 565 rotate about the rotation shaft 564.

The small-diameter gear 565 further meshes with internal teeth 611 that are included on the inner circumferential surface of base portion 61 of the second rotating portion 60. This causes, in accordance with the output of the second motor 56, the second rotating portion 60 to rotate about the second rotation axis in the vertical direction. Because the light source unit 30 is mounted on the second rotating portion 60, the rotation of the second rotating portion 60 about the second rotation axis causes the light source unit 30 to rotate about the second rotation axis. In the example illustrated in FIG. 7, the internal teeth 611 of the second rotating portion 60 are included on a part of the inner circumferential surface of the base portion 61.

The restriction in the rotational range of the second rotating portion 60 will be described. As illustrated in FIG. 7, in the base portion 61 of the second rotating portion 60, a portion between a circumferential end portion 612 and a circumferential end portion 613 is cut out to be lower than the other portions. For example, the portion between the circumferential end portion 612 and the circumferential end portion 613 of the base portion 61 is cut out such that an angle formed by a straight line, which connects the center of the base portion 61 with the circumferential end portion 612, and by a straight line, which connects the center of the base portion 61 with the circumferential end portion 613, is 90 degrees. On the outside of the base portion 61 of the second rotating portion 60, a limit switch 62 is provided. For example, the limit switch 62 is mounted on the rear surface (opposite surface of the surface illustrated in FIG. 6) of the other end portion of the reinforced portion 50 and is provided such that a lever 621 of the limit switch 62 projects to the inside of the base portion 61 from between the circumferential end portion 612 of the base portion 61 and the circumferential end portion 613 thereof.

Accordingly, when the lever 621 of the limit switch 62 is rotated by the circumferential end portion 612 of the base portion 61 or the circumferential end portion 613 thereof, the limit in the rotation angle that has been set is thereby detected and is used for motor control such as stopping the operation of the second motor 56. In the present embodiment, it is assumed that the second rotating portion 60 restricts, by the limit switch 62 and by the circumferential end portion 612 and the circumferential end portion 613 of the base portion 61, the rotation angle in a range of approximately 90 degrees in the vertical direction.

Next, with reference to FIGS. 6 to 8, a mechanism that the arm portion 20 pivotally supports the light source unit 30 will be described. Specifically, a mechanism that the reinforced portion 50 pivotally supports the second rotating portion 60 will be described. As illustrated in FIG. 6, a second shaft 55 is inserted into the insertion portion 550 of the reinforced portion 50. The second shaft 55 has a retaining mechanism on the end portion in the direction of the second rotation axis. In the example illustrated in FIG. 6, a C-ring 551 is attached on the end portion of the second shaft 55 that is inserted into the insertion portion 550 of the reinforced portion 50, and by the C-ring 551, the second shaft 55 is prevented from slipping out from the insertion portion 550 of the reinforced portion 50. As just described, the reinforced portion 50 pivotally supports the second shaft 55 and the second rotating portion 60 in a manner rotatable about the second rotation axis.

Between the insertion portion 550 of the reinforced portion 50 and the C-ring 551, a sliding member 553 is arranged. This prevents the friction due to the rotation of the second rotating portion 60 between the second rotating portion 60 and the reinforced portion 50. For example, for the sliding member 553, the material that reduces various types of friction, such as polyslider, is used. For example, the second rotating portion 60 can smoothly rotate with respect to the reinforced portion 50 with the sliding member 553.

As illustrated in FIG. 7, the central portion of the planar portion of the second rotating portion 60 has a cylindrical insertion hole 63. For example, the insertion hole 63 has a large-diameter portion that is opened in the direction facing the planar portion of the second rotating portion 60 on one end, and a small-diameter portion that is smaller in diameter than the large-diameter portion and is continuous with the other end of the large-diameter portion. The second shaft 55 is inserted into the insertion hole 63 of the second rotating portion 60. For example, the second shaft 55 is press fitted and secured into the small-diameter portion of the insertion hole 63 of the second rotating portion 60. For example, the small-diameter portion of the second rotating portion 60 has a shape corresponding to the outer diameter of the second shaft 55. Accordingly, as illustrated in FIG. 8, the second shaft 55 passes through the small-diameter portion of the insertion hole 63 of the second rotating portion 60, and protrudes on the opposite surface side of the opposing surface to the reinforced portion 50 of the second rotating portion 60, that is, on the fitting portion 66 side. As just described, the second shaft 55 is press fitted and secured into the insertion hole 63 of the second rotating portion 60, and is fitted in a rotatable manner in the insertion portion 550 of the reinforced portion 50. That is, the second shaft 55 is supported by the insertion portion 550 of the reinforced portion 50 and, in accordance with the drive of the second motor 56, rotates together with the second rotating portion 60.

As illustrated in FIG. 8, a C-ring 552 is attached on the end portion of the second shaft 55 that is inserted into the insertion hole 63 of the second rotating portion 60, and by the C-ring 552, the second shaft 55 is prevented from slipping out from the insertion hole 63 of the second rotating portion 60.

As illustrated in FIG. 7, between the reinforced portion 50 and the second rotating portion 60, a spring member 64 is provided along the second shaft 55. For example, for the spring member 64, a coil spring is used. In the example illustrated in FIG. 7, the spring member 64 is arranged such that one end portion faces the end portion of the small-diameter portion of the insertion hole 63 of the second rotating portion 60 and such that the other end portion faces the rear surface of the other end portion of the reinforced portion 50. Accordingly, the spring member 64 biases the reinforced portion 50 and the second rotating portion 60 in a direction away from each other along the second rotation axis. Furthermore, between the other end portion of the spring member 64 and the rear surface of the other end portion of the reinforced portion 50, a washer 641 is provided.

For example, in order to make the second shaft 55 rotatable with respect to the reinforced portion 50, it needs to make the diameter of the inner circumferential surface of the insertion portion 550 of the reinforced portion 50 larger than the outer diameter of the second shaft 55. Thus, due to a gap formed by the difference between the diameter of the inner circumferential surface of the insertion portion 550 and the outer diameter of the second shaft 55, wobbling of the light source unit 30 may be caused. In that case, it may lead to the breakage of the coupling portion of the arm portion 20 and the light source unit 30. Thus, in the lighting apparatus 1, by providing the spring member 64 between the reinforced portion 50 and the second rotating portion 60, it is made possible to prevent the wobbling due to the vibration by the rotation of the lighting apparatus 1, the influence of wind, and others by the bias of the spring member 64. This can prevent the breakage of the lighting apparatus 1.

The following describes the configuration of the light source unit 30. As illustrated in FIGS. 1 and 2, the light source unit 30 includes a housing portion 31, an adjustment unit 32, a cover portion 33, and a heat dissipation unit 34. In the light source unit 30, the housing portion 31 holds the adjustment unit 32, the cover portion 33, the heat dissipation unit 34, and others. The light source unit 30 further includes, as an electronic component to be an object of changing the orientation, the light emitting element 101 (see FIG. 11) such as a light emitting diode (LED) arranged on a substrate 100, for example. That is, the light source unit 30 is a lighting body the irradiation direction of which is changeable. The substrate 100 on which the light emitting element 101 is arranged is mounted on a mounting surface 36 (see FIG. 15) of the heat dissipation unit 34, which will be described in detail later.

The housing portion 31 has a cylindrical shape and is provided with a cylindrical projecting portion 311 on a part of the outer circumferential surface. In FIG. 1, on the outer circumferential surface of the housing portion 31, the projecting portion 311 is provided on the right-hand side. For example, the fitting portion 66 of the second rotating portion 60 is inserted into the projecting portion 311 of the housing portion 31, and by a mounting mechanism such as fixing screws, the housing portion 31 is mounted on the second rotating portion 60. As just described, the light source unit 30 is mounted on the other end portion side of the arm portion 20, and rotates about the second rotation axis by the second motor 56 together with the second rotating portion 60. For example, the light source unit 30 rotates about the second rotation axis in the vertical direction, in accordance with the drive of the second motor 56.

Figure 9:
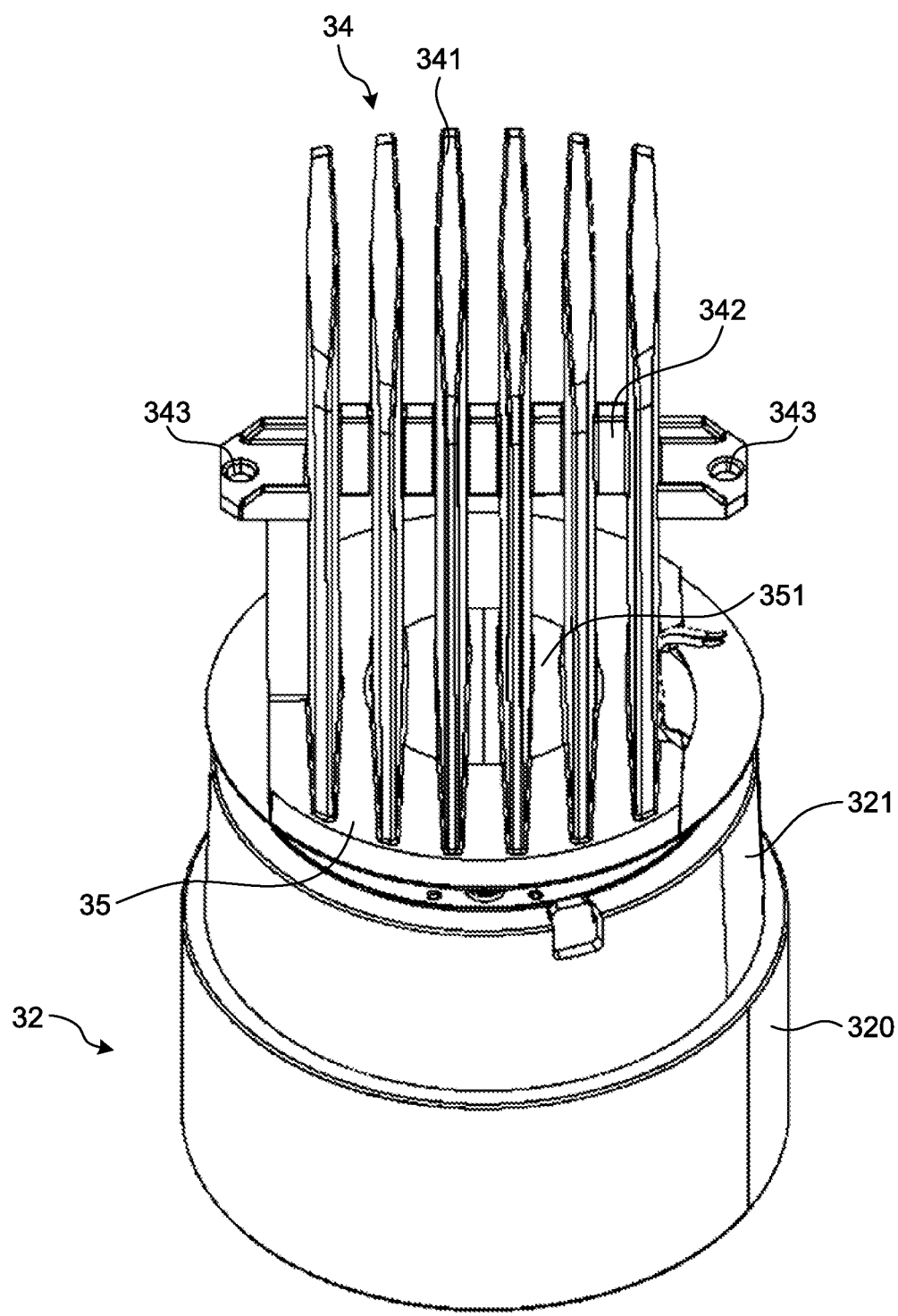
FIG. 9 is a perspective view illustrating a light source unit of the lighting apparatus in the embodiment.

Next, with reference to FIG. 9, the configuration inside the housing portion 31 of the light source unit 30 will be described. FIG. 9 is a perspective view illustrating the light source unit of the lighting apparatus in the embodiment. Specifically, FIG. 9 is a perspective view illustrating the light source unit 30, except for the housing portion 31, in order to illustrate the configuration inside the housing portion 31. As illustrated in FIG. 9, the heat dissipation unit 34 is what is called a heat sink, and includes a base portion 35, a plurality of heat dissipating fins 341, and a rib 342. In the example illustrated in FIG. 9, the base portion 35 has a shape in which a part of opposing circumferential walls of a circular disc is cut out. Furthermore, six heat dissipating fins 341 are provided in an upright manner from the base portion 35. The rib 342 is provided along the direction in which the heat dissipating fins 341 are arranged such that the portions between the heat dissipating fins 341 are coupled with each other.

In the example illustrated in FIG. 9, the heat dissipation unit 34 is mounted on the housing portion 31 via a mounting mechanism such as fixing screws by insertion holes 343 provided on both end portions of the rib 342. For example, by fixing with screws the insertion holes 343, and insertion holes (depiction omitted) corresponding to the insertion holes 343, the heat dissipation unit 34 is mounted on the housing portion 31. The foregoing is one example, and the mounting mechanism of the heat dissipation unit 34 onto the housing portion 31 may be any mounting mechanism.

In the central portion of the surface (hereinafter also referred to as "rear surface") of the base portion 35 on which the heat dissipating fins 341 are provided in an upright manner, a projecting portion 351 projecting in a spherical cap shape is provided. In the central portion of the opposite surface (hereinafter also referred to as "surface") of the rear surface of the base portion 35, the substrate 100 (see FIG. 15) is arranged. As just described, in the rear surface of the base portion 35, by providing the projecting portion 351 at the position overlapping the substrate 100 on which the light emitting element 101 that is a heat source of the light source unit 30 is arranged, the heat from the substrate 100 can be efficiently transferred to the heat dissipating fins 341 on the rear surface. The configuration on the surface side of the base portion 35 will be described in detail later.

The adjustment unit 32 includes a first barrel portion 320 that has a cylindrical shape, and a second barrel portion 321 that is smaller in diameter than the first barrel portion 320 and is continuous with the first barrel portion 320. As illustrated in FIGS. 1 and 2, the adjustment unit 32 is provided such that the second barrel portion 321 is arranged inside the housing portion 31 and such that the first barrel portion 320 is exposed. On an opening portion of the first barrel portion 320 of the adjustment unit 32, the circular disc-like cover portion 33 is attached by an annular mounting member 331. With the cover portion 33, the inside of the adjustment unit 32 is protected.

As illustrated in FIG. 9, the adjustment unit 32 is provided in an overlapping manner on the mounting side of the light emitting element 101 of the base portion 35. For example, the adjustment unit 32 is provided such that the opening portion of the second barrel portion 321 overlaps on the mounting side of the light emitting element 101 of the base portion 35.

Figure 10:
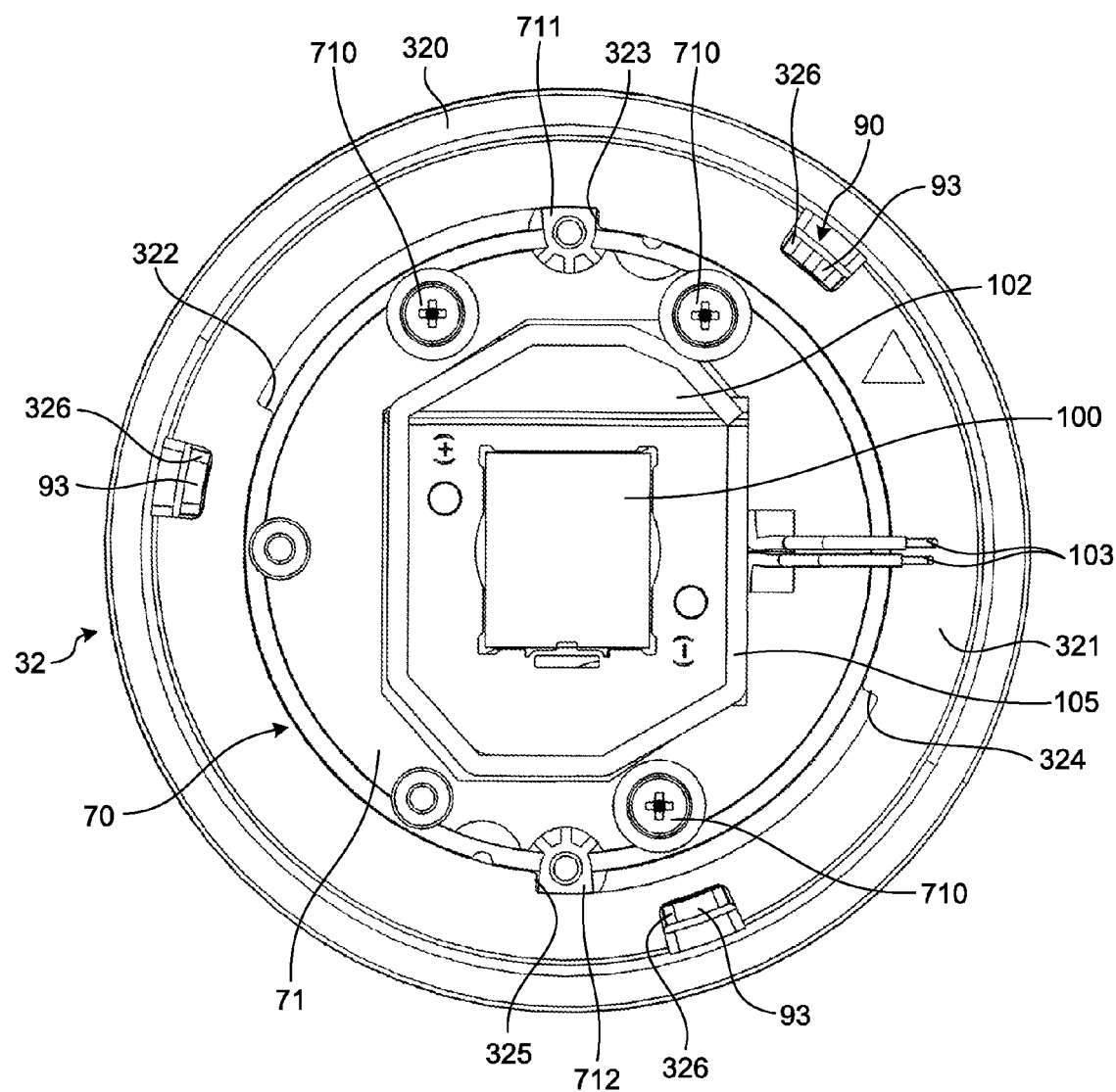
FIG. 10 is a plan view illustrating a principal part of the light source unit of the lighting apparatus in the embodiment.

The lighting apparatus 1 has a zoom function and, for example, an operator of the lighting apparatus 1, by manually rotating the first barrel portion 320 of the adjustment unit 32, changes the focus of the light emitted from the light source unit 30. The following describes the configuration concerning this zoom mechanism with reference to FIGS. 10 to 14. FIG. 10 is a plan view illustrating a principal part of the light source unit of the lighting apparatus in the embodiment. Specifically, FIG. 10 is a plan view that is viewed from the heat dissipation unit 34 side, except for the heat dissipation unit 34, in order to illustrate the zoom mechanism. For example, FIG. 10 illustrates the face side of the substrate 100 which is mounted on the heat dissipation unit 34.

Figure 11:
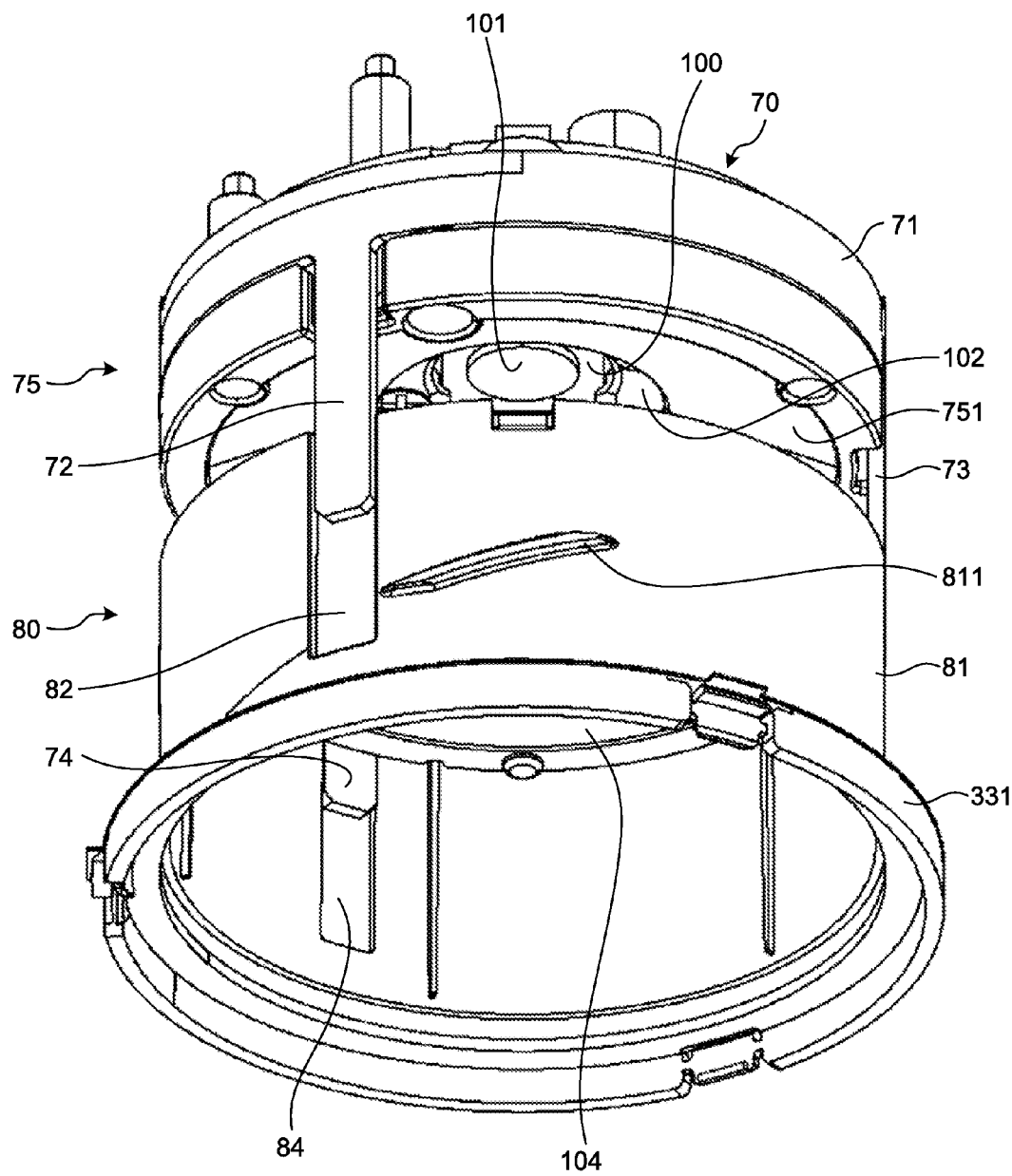
FIG. 11 is a perspective view illustrating a zoom mechanism of the lighting apparatus in the embodiment.
Figure 12:
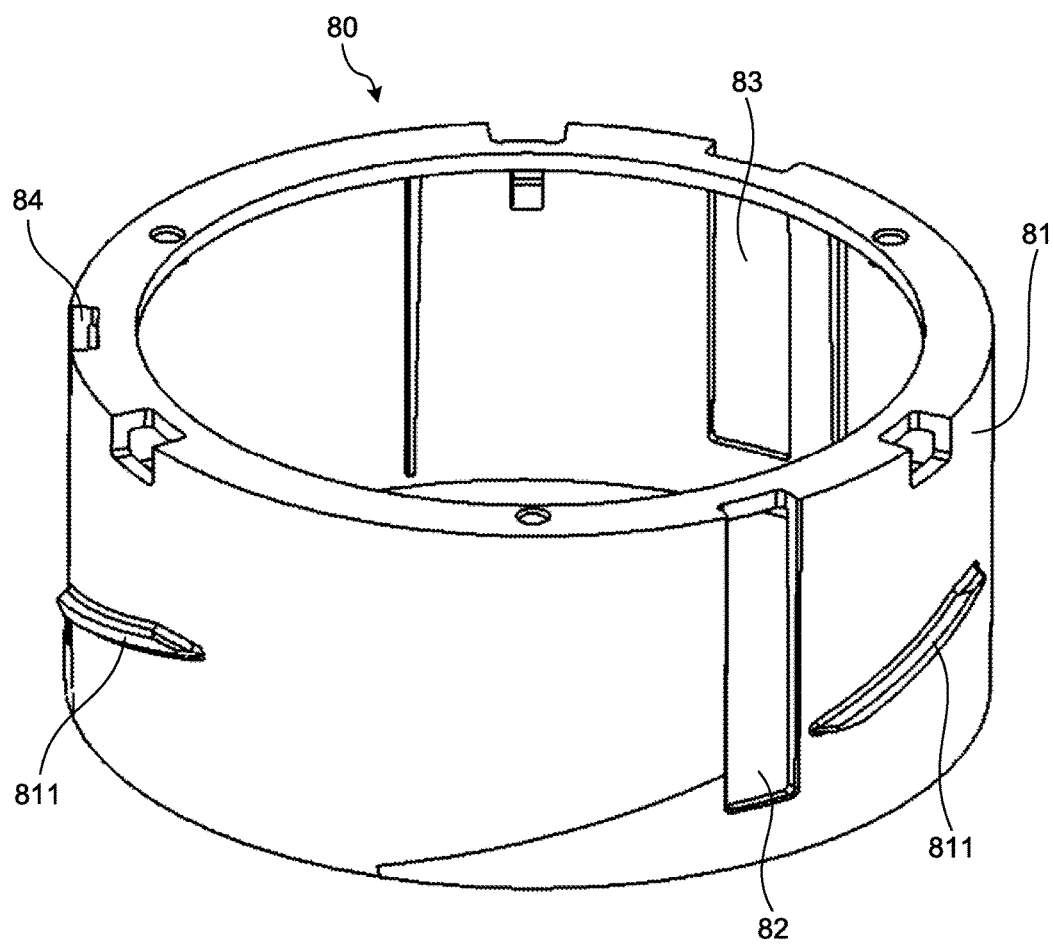
FIG. 12 is a perspective view illustrating an alignment portion of the lighting apparatus in the embodiment.
Figure 13:
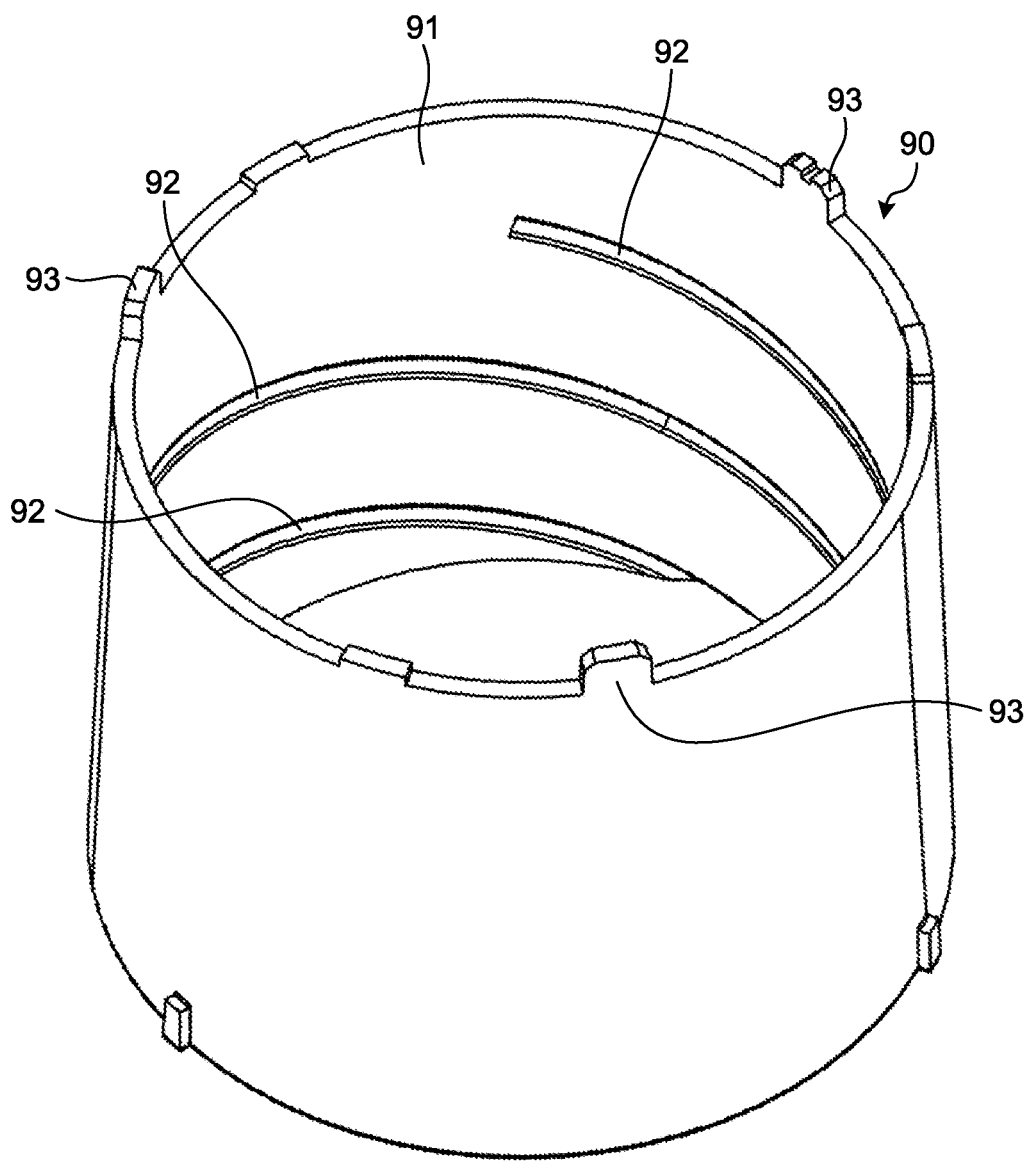
FIG. 13 is a perspective view illustrating a rotary portion of the lighting apparatus in the embodiment.
Figure 14:
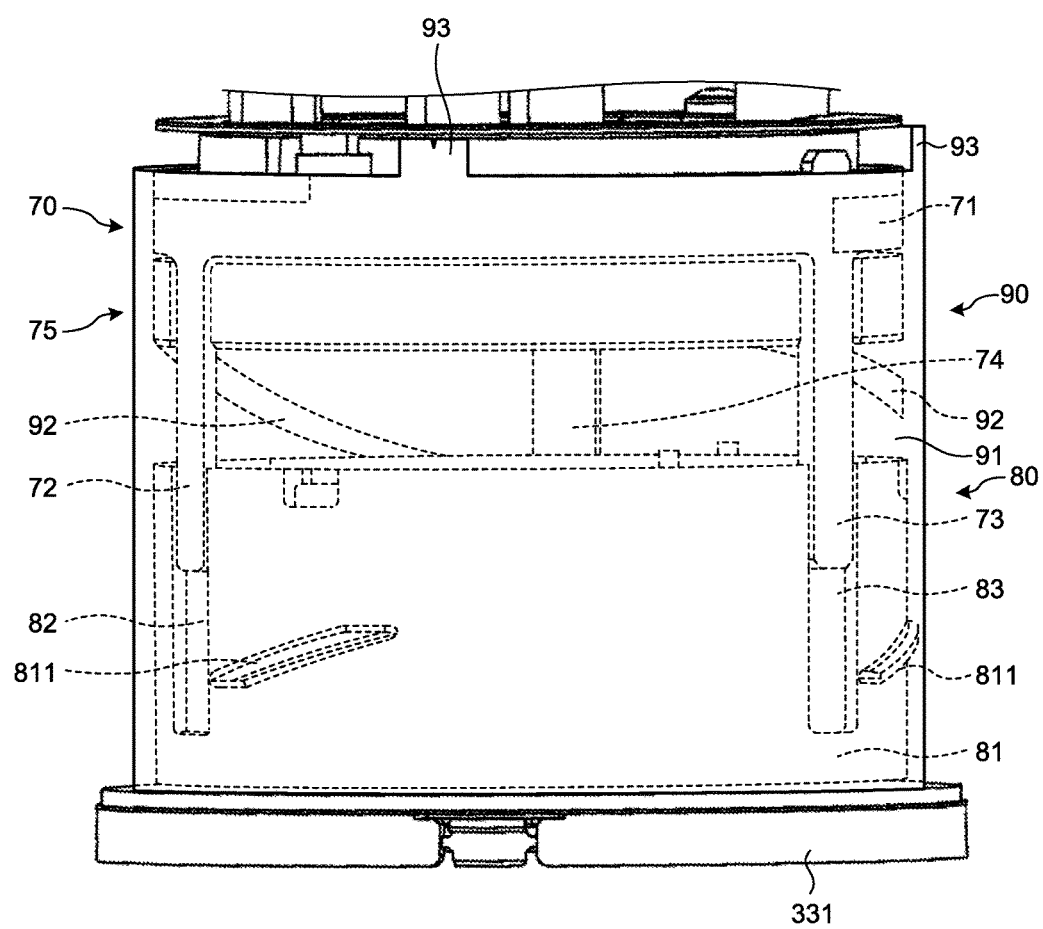
FIG. 14 is a partially transparent view illustrating the zoom mechanism of the lighting apparatus in the embodiment.

FIG. 11 is a perspective view illustrating the zoom mechanism of the lighting apparatus in the embodiment. Specifically, FIG. 11 is a perspective view that illustrates the configuration of the inside of the adjustment unit 32, except for the adjustment unit 32, in order to illustrate the zoom mechanism. FIG. 12 is a perspective view illustrating an alignment portion of the lighting apparatus in the embodiment. FIG. 13 is a perspective view illustrating a rotary portion of the lighting apparatus in the embodiment. FIG. 14 is a partially transparent view illustrating the zoom mechanism of the lighting apparatus in the embodiment. FIG. 14 is a perspective view that is seen through a rotary portion 90, except for the adjustment unit 32, in order to illustrate positional relation of the respective configurations of the zoom mechanism.

As illustrated in FIG. 10, the central portion of the opening portion of the second barrel portion 321 in the adjustment unit 32 has the substrate 100 on which the light emitting element 101 is arranged is located. As in the foregoing, it is assumed that the substrate 100 is mounted on the surface side of the heat dissipation unit 34. On the periphery of the substrate 100, a retaining member 102 is provided, and to the light emitting element 101, the electrical power is supplied via wiring 103.

The adjustment unit 32 further includes a rotation restriction portion 70, a reflection portion 75, an alignment portion 80, and the rotary portion 90.

The rotation restriction portion 70 includes a circular disc-like base portion 71 having an opening in the center, and a plurality of claw portions 72, 73, and 74 that project in the axial direction of the base portion 71 from a circumferential wall of the base portion 71. In the example illustrated in FIG. 11, three claw portions 72, 73, and 74 project in the axial direction of the base portion 71 from the circumferential wall of the base portion 71. For example, the three claw portions 72, 73, and 74 are provided at an interval of 120 degrees along the outer circumference of the base portion 71. In the opening portion of the base portion 71, the light emitting element 101, the substrate 100, and the retaining member 102 are arranged. That is, the light emitting element 101 is arranged on the base portion 71 of the rotation restriction portion 70 so as to be exposed in the projecting direction of the claw portions 72, 73, and 74. For example, the retaining member 102 may be a chip-on-board (COB) holder or the like. On the outer circumferential portion of the retaining member 102, a sealing member 105 is provided. Providing the sealing member 105 can prevent, for example, an insect such as a leaf beetle that entered from a small gap of the housing portion 31 or the like from getting into an area that emits light surrounded by the light emitting element 101, the substrate 100, a reflecting surface 751 of the reflection portion 75, an optical member 104, and others. As just described, the sealing member 105 has the functions of insect repelling, dust prevention, and the like, for example. For example, for the sealing member 105, boron (sponge rubber), foamed rubber, and the like are used.

In the example illustrated in FIG. 10, the rotation restriction portion 70 is mounted on the housing portion 31 via a mounting mechanism such as fixing screws by insertion holes (depiction omitted) provided on the base portion 71. For example, the rotation restriction portion 70 is mounted on the housing portion 31 by screwing, with screw members 710, the insertion holes provided on the base portion 71 and insertion holes (depiction omitted) of the housing portion 31 corresponding to the insertion holes. The foregoing is one example, and the mounting mechanism of the rotation restriction portion 70 onto the housing portion 31 may be any mounting mechanism.

For the rotation restriction portion 70, the outer diameter of the base portion 71 thereof is larger than the opening portion of the second barrel portion 321 in the adjustment unit 32, and the base portion 71 is inserted into the second barrel portion 321 and comes into contact with the opening portion of the second barrel portion 321. Accordingly, the adjustment unit 32 is supported in a rotatable manner by the rotation restriction portion 70 mounted on the housing portion 31. That is, when the operator of the lighting apparatus 1 manually rotates the first barrel portion 320 of the adjustment unit 32, the opening portion of the second barrel portion 321 is provided in a slidable manner with respect to the base portion 71 of the rotation restriction portion 70.

As in the foregoing, because the first barrel portion 320 is manually rotated by human hands, it may wobble, and thus an annular plate spring (depiction omitted) may be provided between the opening portion of the second barrel portion 321 and the base portion 71 of the rotation restriction portion 70. This can prevent the wobbling when the operator of the lighting apparatus 1 manually rotates the first barrel portion 320 of the adjustment unit 32. When a metal material such as aluminum is used for the rotation restriction portion 70, a spacer as a sliding member may be arranged between the plate spring and the rotation restriction portion 70. This can prevent the plate spring and the rotation restriction portion 70 from coming into contact directly, that is, can prevent the metals from coming into contact directly. For example, for the spacer, the material that reduces various types of friction, such as polyslider, may be used.

The restriction in the rotational range of the first barrel portion 320 of the adjustment unit 32 and of the second barrel portion 321 thereof will be described. As illustrated in FIG. 10, the opening portion of the second barrel portion 321 is cut out between a circumferential end portion 322 and a circumferential end portion 323, and the outer diameter thereof is larger than the other opening portion. For example, the portion between the circumferential end portion 322 of the opening portion of the second barrel portion 321 and the circumferential end portion 323 is cut out such that an angle formed by a straight line, which connects the center of an opening plane of the second barrel portion 321 with the circumferential end portion 322, and by a straight line, which connects the center of the opening plane of the second barrel portion 321 with the circumferential end portion 323, is 60 degrees. Furthermore, a circumferential end portion 324 and a circumferential end portion 325 are in the positions opposite to the circumferential end portion 322 and the circumferential end portion 323 across the center of the opening plane of the second barrel portion 321. For example, the opening portion of the second barrel portion 321 is cut out between the circumferential end portion 324 and the circumferential end portion 325, and the outer diameter thereof is larger than the other portion. For example, the portion between the circumferential end portion 324 of the opening portion of the second barrel portion 321 and the circumferential end portion 325 is cut out such that an angle formed by a straight line, which connects the center of an opening plane of the second barrel portion 321 with the circumferential end portion 324, and by a straight line, which connects the center of the opening plane of the second barrel portion 321 with the circumferential end portion 325, is 60 degrees.

Between the circumferential end portion 322 of the second barrel portion 321 in the base portion 71 of the rotation restriction portion 70 and the circumferential end portion 323, a screw mounting portion 711 projects from the opening portion of the second barrel portion 321 to the outside. Between the circumferential end portion 324 of the second barrel portion 321 in the base portion 71 of the rotation restriction portion 70 and the circumferential end portion 325, a screw mounting portion 712 projects from the opening portion of the second barrel portion 321 to the outside.

Accordingly, the screw mounting portion 711 comes into contact with the circumferential end portion 322 of the second barrel portion 321 or the circumferential end portion 323 thereof, and thus the rotational range of the first barrel portion 320 of the adjustment unit 32 and the second barrel portion 321 thereof is restricted with respect to the rotation restriction portion 70. Furthermore, the screw mounting portion 712 comes into contact with the circumferential end portion 324 of the second barrel portion 321 or the circumferential end portion 325 thereof, and thus the rotational range of the first barrel portion 320 of the adjustment unit 32 and the second barrel portion 321 thereof is restricted with respect to the rotation restriction portion 70. The rotational range of the first barrel portion 320 of the adjustment unit 32 and the second barrel portion 321 thereof may be restricted with respect to the rotation restriction portion 70, by screw members (depiction omitted) inserted into the insertion holes of the screw mounting portions 711 and 712. For example, when the screw members inserted into the insertion hole of the screw mounting portion 711 contact with the circumferential end portion 322 of the second barrel portion 321 or the circumferential end portion 323 thereof, the rotational range of the first barrel portion 320 of the adjustment unit 32 and the second barrel portion 321 thereof may be restricted with respect to the rotation restriction portion 70.

The reflection portion 75 is arranged on the base portion 71 of the rotation restriction portion 70 in an overlapping manner with the reflecting surface 751 being placed in the direction facing the light emitting element 101. In the example illustrated in FIG. 11, the reflection portion 75 is arranged in an overlapping manner on the base portion 71 of the rotation restriction portion 70 in the projecting direction of the claw portions 72, 73, and 74.

As illustrated in FIG. 12, the alignment portion 80 includes a cylindrical barrel portion 81, and the barrel portion 81 is arranged on the rotation restriction portion 70 and the reflection portion 75 in an overlapping manner. For example, the barrel portion 81 of the alignment portion 80 is supported by the mounting member 331. The barrel portion 81 of the alignment portion 80 has a plurality of restriction grooves 82, 83, and 84 that are cut out in the axial direction from the circumferential end portion facing the reflection portion 75. As illustrated in FIGS. 11 and 14, three restriction grooves 82, 83, and 84 are cut out in the axial direction from the circumferential end portion facing the reflection portion 75 of the barrel portion 81. For example, the three restriction grooves 82, 83, and 84 are provided at an interval of 120 degrees along the outer circumference of the barrel portion 81.

The outer diameter of the barrel portion 81 of the alignment portion 80 is made to be the same as or similar to the outer diameter of the base portion 71 of the rotation restriction portion 70, and the claw portions 72, 73, and 74 of the rotation restriction portion 70 are inserted into the restriction grooves 82, 83, and 84 of the alignment portion 80, respectively. For example, it is assumed that the length of the restriction grooves 82, 83, and 84 is made to be the same as or similar to the length of the claw portions 72, 73, and 74, and that the width of the restriction grooves 82, 83, and 84 is a width that allows the claw portions 72, 73, and 74 to move back and forth with respect to the bottom of the cutout. For example, in the case of FIG. 14, the claw portion 72 is movable back and forth in the up-and-down direction with respect to the restriction groove 82.

On the outer circumferential surface of the barrel portion 81 of the alignment portion 80, a plurality of spirally formed projecting portions 811 are provided. For example, on the outer circumferential surface of the barrel portion 81 of the alignment portion 80, three projecting portions 811 are provided at equal intervals along the outer circumference of the barrel portion 81. For example, the three projecting portions 811 are provided at an interval of 120 degrees along the outer circumference of the barrel portion 81.

As illustrated in FIG. 13, the rotary portion 90 includes a cylindrical barrel portion 91, and is arranged so as to cover the alignment portion 80 and a part of the base portion 71 of the rotation restriction portion 70. For example, the barrel portion 91 of the rotary portion 90 is supported by the mounting member 331. Furthermore, for example, the inner diameter of the barrel portion 91 of the rotary portion 90 is larger than the outer diameter of the barrel portion 81 of the alignment portion 80.

On the inner circumferential surface of the barrel portion 91 of the rotary portion 90, a plurality of spirally formed grooves 92 are provided. For example, on the inner circumferential surface of the barrel portion 91 of the rotary portion 90, three grooves 92 are provided at equal intervals along the inner circumference of the barrel portion 91. For example, the three grooves 92 are provided at an interval of 120 degrees along the outer circumference of the barrel portion 91.

For example, as the barrel portion 81 of the alignment portion 80 is screwed in the barrel portion 91 of the rotary portion 90 such that each of the projecting portions 811 of the alignment portion 80 is fitted in the respective grooves 92 of the rotary portion 90, the barrel portion 81 of the alignment portion 80 is located in a rotatable manner inside the barrel portion 91 of the rotary portion 90.

On one end portion (upper end portion in FIG. 13) in the axial direction of the barrel portion 91 of the rotary portion 90, a plurality of projecting pieces 93 are provided. For example, on the one end portion in the axial direction of the barrel portion 91 of the rotary portion 90, three projecting pieces 93 are provided at equal intervals along the outer circumference of the barrel portion 91. For example, the three projecting pieces 93 are provided at an interval of 120 degrees along the outer circumference of the barrel portion 91.

On the outer circumferential end of the opening plane of the second barrel portion 321 in the adjustment unit 32, a plurality of cutout holes 326 are provided. For example, on the outer circumferential end of opening plane of the second barrel portion 321, three cutout holes 326 are provided at equal intervals along the outer circumference of the second barrel portion 321. For example, the three cutout holes 326 are provided at an interval of 120 degrees along the outer circumference of the second barrel portion 321.

For example, the length of the cutout holes 326 in the circumferential direction of the second barrel portion 321 is made to be the same as or similar to the length of the projecting pieces 93 in the circumferential direction of the rotary portion 90, and the projecting pieces 93 of the second barrel portion 321 are fitted into the respective cutout holes 326 of the second barrel portion 321. Accordingly, the rotary portion 90 rotates together with the first barrel portion 320 and the second barrel portion 321. For example, the manual rotation of the first barrel portion 320 of the adjustment unit 32 by the operator of the lighting apparatus 1 causes the rotary portion 90 also to rotate together with the first barrel portion 320 and the second barrel portion 321.

In the alignment portion 80, the rotation about the axis of the barrel portion 81 is restricted by the rotation restriction portion 70. Specifically, in the alignment portion 80, because the claw portions 72, 73, and 74 of the rotation restriction portion 70 are being inserted into the respective restriction grooves 82, 83, and 84, the rotation about the axis of the barrel portion 81 is restricted with respect to the rotation restriction portion 70. For example, in the case of FIG. 14, while the alignment portion 80 is movable in the up-and-down direction, the rotation about the axis extending in the up-and-down direction is restricted. Meanwhile, the rotary portion 90 rotates about the axis extending in the up-and-down direction in accordance with the rotation of the first barrel portion 320 and the second barrel portion 321.

Thus, in accordance with the variation in the positions of the grooves 92 of the rotary portion 90 by the rotation of the rotary portion 90, the positions in the axial direction of the projecting portions 811 vary while the positions in the rotational direction of the projecting portions 811 of the alignment portion 80 are restricted. The alignment portion 80 converts the rotation about the axis of the rotary portion 90 into the move in the axial direction. Accordingly, the alignment portion 80 moves back and forth in the axial direction, in accordance with the rotation about the axis of the rotary portion 90. The back and forth movement of the alignment portion 80 in the axial direction causes the distance between the light emitting element 101 and the optical member 104 to be changed to achieve the zoom function. For example, the optical member 104 may be a diffusion plate, a Fresnel lens, or the like. The zoom function as in the foregoing can be applied to a zoom function of the lens of a camera, for example.

In the present embodiment, for the grooves 92 of the rotary portion 90, only three of them are provided at an interval of 120 degrees and provided only in a range that the alignment portion 80 moves back and forth. For the projecting portions 811 as well that mesh with the grooves 92 of the rotary portion 90, only three of them are provided at an interval of 120 degrees and provided only in a certain length. As just described, providing three each of the grooves 92 of the rotary portion 90 and the projecting portions 811 of the alignment portion 80 enables the alignment portion 80 to move back and forth in a good balance with three supporting points. The length of the projecting portions 811 of the alignment portion 80 may be made in a length needed to mesh with the grooves 92 of the rotary portion 90 and move back and forth, or the projecting portions 811 of the alignment portion 80 may be provided on the whole circumference of the barrel portion 81.

Figure 15:
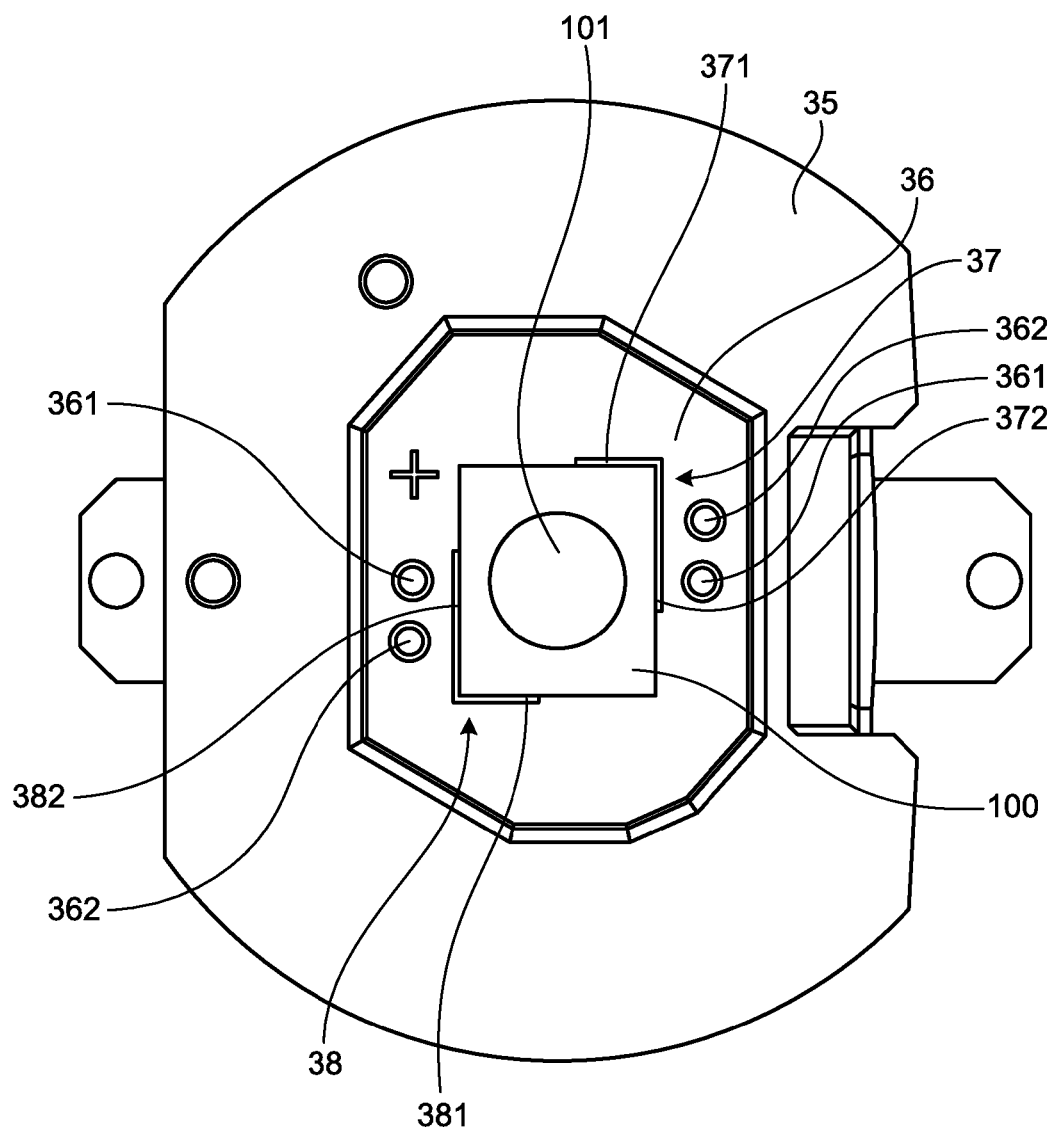
FIG. 15 is a plan view illustrating recessed portions serving as coating agent reservoirs of the lighting apparatus in the embodiment.
Figure 16:
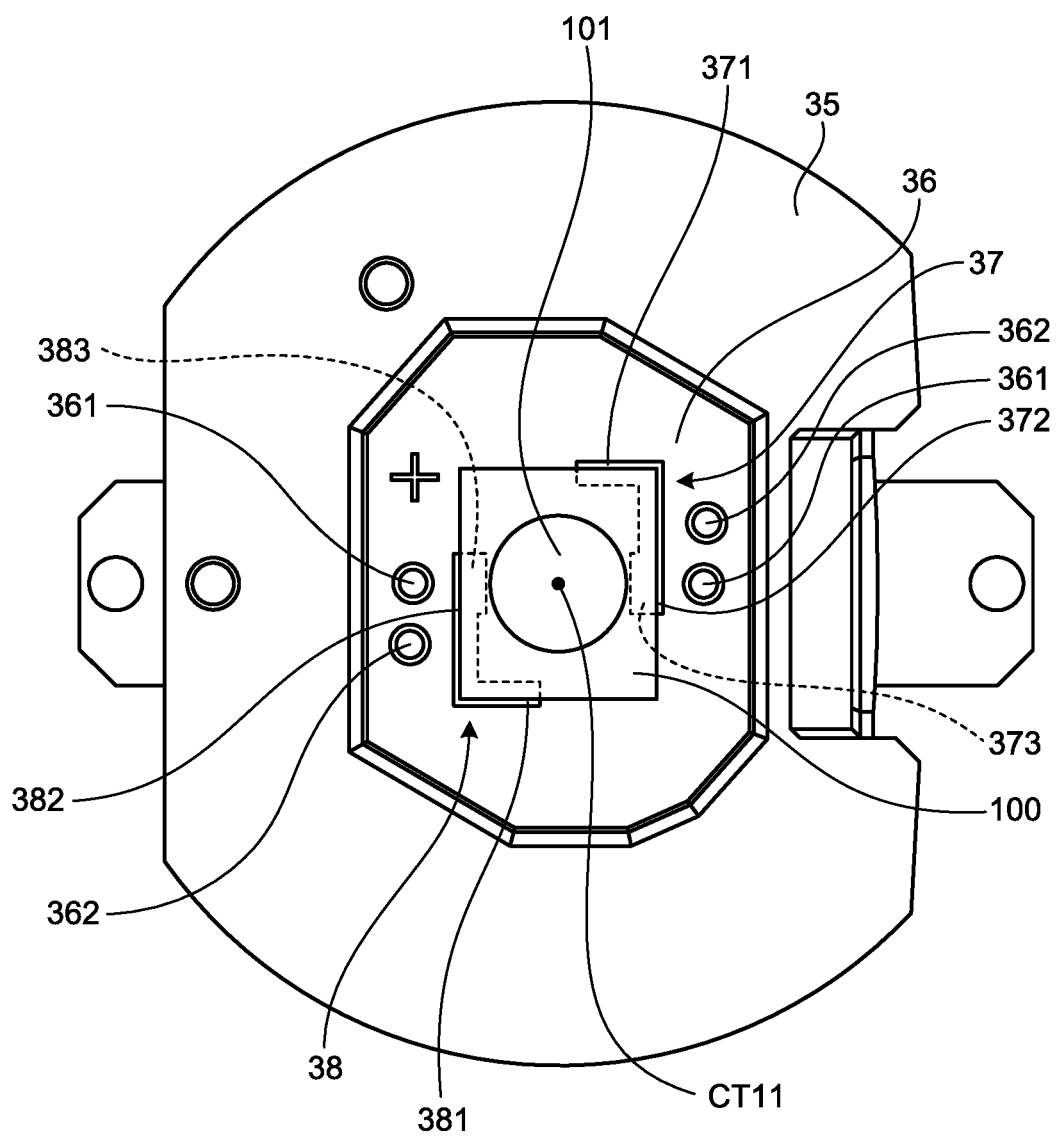
FIG. 16 is a partially transparent view illustrating the recessed portions serving as the coating agent reservoirs of the lighting apparatus in the embodiment.
Figure 17:
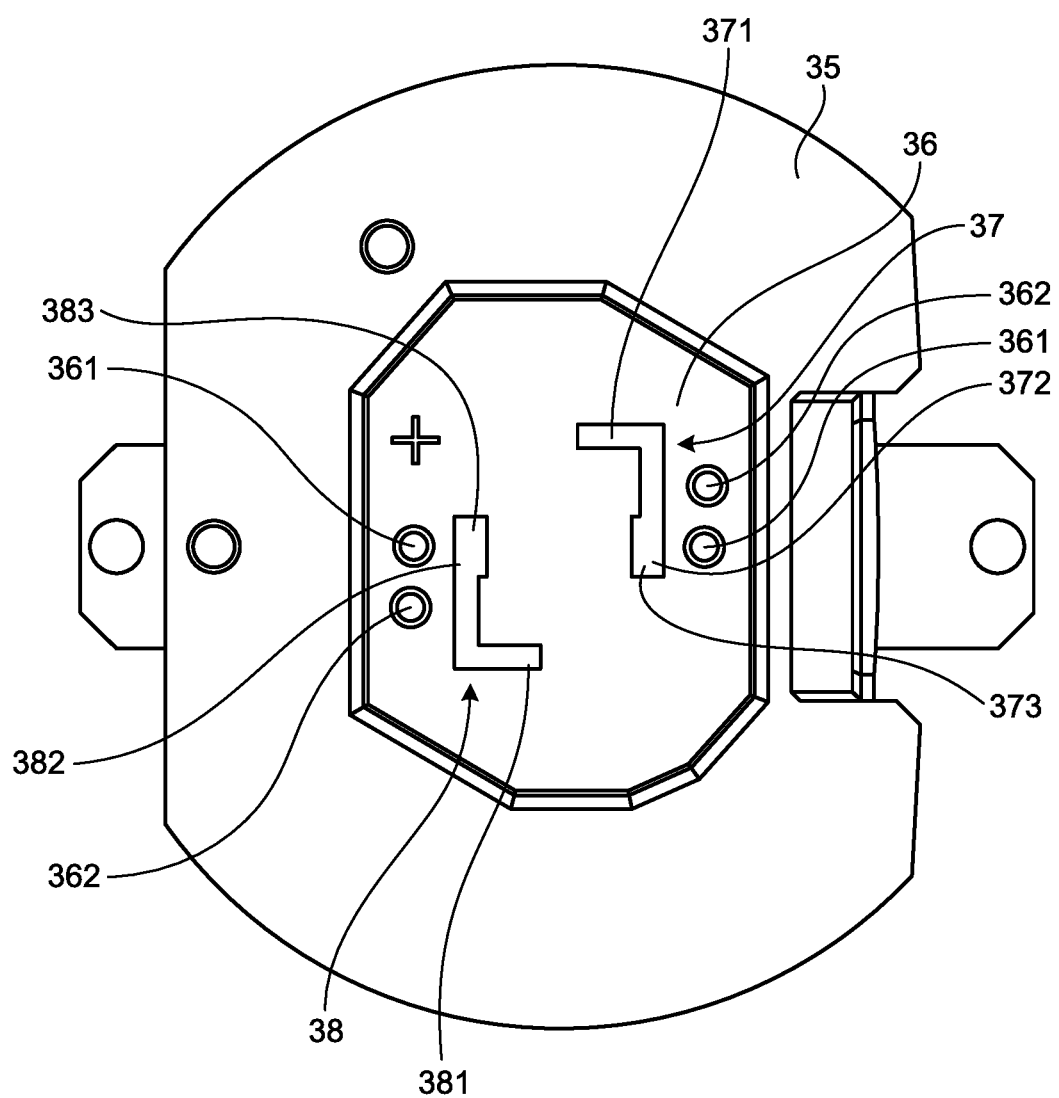
FIG. 17 is a plan view illustrating the recessed portions serving as the coating agent reservoirs of the lighting apparatus in the embodiment.

The following describes, with reference to FIGS. 15 to 17, the mounting on the heat dissipation unit 34 the substrate 100 on which the light emitting element 101 is arranged. FIGS. 15 to 17 are plan views illustrating recessed portions serving as coating agent reservoirs of the lighting apparatus in the embodiment. Specifically, FIG. 15 is a plan view illustrating grooves 37 and 38 serving as recessed portions. FIG. 16 is a plan view seen through the substrate 100 illustrating the grooves 37 and 38 as the recessed portions. FIG. 17 is a plan view that illustrates the grooves 37 and 38 as the recessed portions, with the substrate 100 being removed.

As illustrated in FIG. 15, the central portion of the surface of the base portion 35 has a mounting surface 36 projecting more than the other area. The recessed portions include a plurality of grooves 37 and 38, and the grooves 37 and 38 are provided along the circumferential end portion of the substrate 100.

On the mounting surface 36 of the base portion 35, the substrate 100 on which the light emitting element 101 is arranged is mounted, via grease as a coating agent, by the retaining member 102. For example, for the grease, a material of high thermal conductivity is used. That is, the substrate 100 is arranged on the mounting surface 36 of the base portion 35, and on the contact surface between the heat dissipation unit 34 and the substrate 100, the grease of high thermal conductivity is applied. The substrate 100 is, in planar view of the mounting surface 36 of the base portion 35, mounted on the mounting surface 36 with a part of the recessed portions being exposed. As illustrated in FIG. 15, in planar view of the mounting surface 36 of the base portion 35, the substrate 100 is mounted on the mounting surface 36 with a part of the grooves 37 and 38 being exposed. The coating agent only needs to have thermal conductivity, and it may be an adhesive or the like.

The recessed portions are, in planar view of the mounting surface 36 of the base portion 35, made to be point-symmetric with respect to the center of the substrate 100. As illustrated in FIG. 16, in planar view of the mounting surface 36 of the base portion 35, the grooves 37 and 38 are made to be point-symmetric with respect to the center CT11 of the substrate 100.

As illustrated in FIG. 15, the outer circumference of the substrate 100 has a rectangular shape in planar view of the mounting surface 36 of the base portion 35, and the grooves 37 and 38 include extending portions 371, 372, 381, and 382 that extend from a corner of the substrate 100 in planar view of the mounting surface 36 of the base portion 35 along two respective sides forming the corner. For example, as illustrated in FIG. 17, the groove 37 includes the extending portions 371 and 372 that extend from the corner (the upper-right corner in FIG. 17) of the substrate 100 in planar view of the mounting surface 36 of the base portion 35 along the two respective sides forming the corner. Furthermore, for example, as illustrated in FIG. 17, the groove 38 includes the extending portions 381 and 382 that extend from the corner (the lower-left corner in FIG. 17) of the substrate 100 in the planar view of the mounting surface 36 of the base portion 35 along the two respective sides forming the corner. The shape of the outer circumference of the substrate 100 in planar view of the mounting surface 36 of the base portion 35 is not limited to a rectangular shape, and it may be in a shape in which a side having the circumferential end includes a curve line such as a circle and an ellipse.

Out of the extending portions 371, 372, 381, and 382, end portions 373 and 383 of the extending portions 372 and 382 extending along the longitudinal direction of the substrate 100 in planar view of the mounting surface 36 of the base portion 35 are larger in width as compared with the other portions. For example, as illustrated in FIG. 17, the end portion 373 of the extending portion 372 in the groove 37 is larger in width in the direction of the center (left-hand direction in FIG. 17) of the mounting surface 36 as compared with the other portions. Furthermore, for example, as illustrated in FIG. 17, the end portion 383 of the extending portion 382 in the groove 38 is larger in width in the direction of the center (right-hand direction in FIG. 17) of the mounting surface 36 as compared with the other portions.

The recessed portions are included in the areas of the mounting surface 36 that overlap portions other than the center CT11 of the substrate 100 in planar view of the mounting surface 36 of the base portion 35. As illustrated in FIG. 16, the grooves 37 and 38 are included in the areas of the mounting surface 36 that overlap the portions other than the center CT11 of the substrate 100 in planar view of the mounting surface 36 of the base portion 35.

For example, when slightly more grease is applied, the grease may leak out from the circumferential end portion of the substrate 100 that is arranged on the mounting surface 36 of the base portion 35. In this case, the grease may run onto the substrate 100, and the grease may adhere to the face (light emitting surface) of the substrate 100 on which the light emitting element 101 is provided. When the grease adheres onto the light emitting surface of the substrate 100, it may lead to the reduction in the light intensity of the light emitting element 101 or to the malfunction thereof. Thus, in the lighting apparatus 1, as illustrated in FIG. 17, the grooves 37 and 38 for coating agent reservoirs are provided on the mounting surface 36 of the base portion 35. The grooves 37 and 38 are grooves that are provided along the substrate 100. Thus, when the grease flows into the grooves 37 and 38, it is possible to prevent the run of the grease onto the light emitting surface of the substrate 100. The grooves 37 and 38 have a substantially L-shape as in FIG. 17, and are provided along a part of the circumferential end portion of the substrate 100, at least at two places, and to be point-symmetric with respect to the center CT11 of the substrate 100. Consequently, it is possible to shorten the machining time as compared with when the grooves 37 and 38 are provided on the whole circumference of the substrate 100. In the mounting surface 36 of the base portion 35, because the area including the grooves 37 and 38 is small, it is possible to secure sufficient heat dissipation. Furthermore, the grooves 37 and 38 can also serve as a guide in the positioning of the substrate 100 and, in planar view of the mounting surface 36, are made to overlap at least a part of the circumferential end portion of the substrate 100.

As illustrated in FIGS. 15 to 17, on the mounting surface 36 of the base portion 35, a plurality of (for example, four) screw holes are provided. For example, on the mounting surface 36 of the base portion 35, a pair of screw holes 361 and a pair of screw holes 362 are provided. The pair of screw holes 361 and the pair of screw holes 362 are screw holes to fix the retaining member 102. For example, when a small light emitting element 101 and the substrate 100 are used, the pair of screw holes 361 are used as screw holes to fix the retaining member 102 of a corresponding size. Furthermore, for example, when a large light emitting element 101 and the substrate 100 are used, the pair of screw holes 362 are used as screw holes to fix the retaining member 102 of a corresponding size. As just described, in the example illustrated in FIGS. 15 to 17, the lighting apparatus 1 can also accommodate two types (a plurality of types) of electronic components (light emitting element 101). That is, the lighting apparatus 1 can be applied regardless of the type of electronic components.

Figure 18:
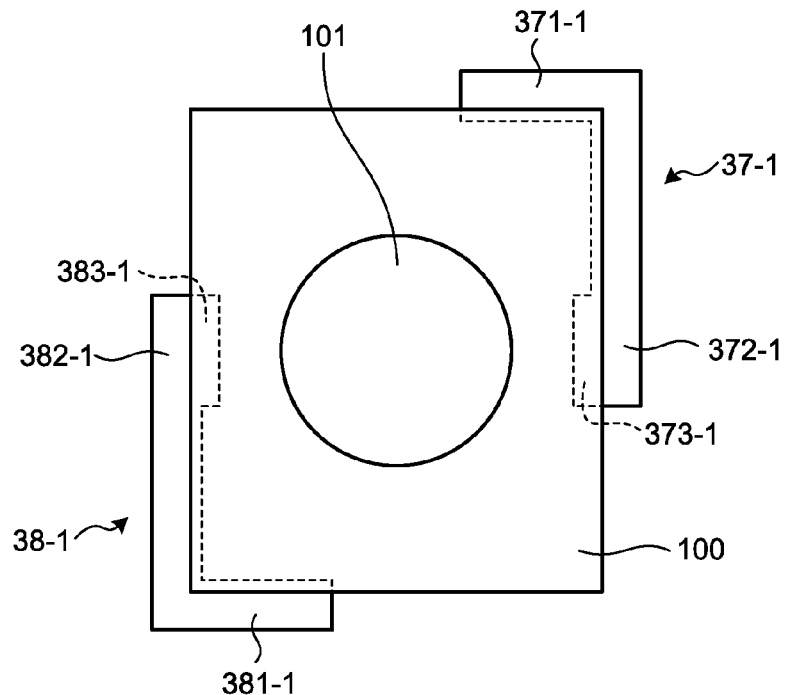
FIG. 18 is a schematic diagram illustrating the relation between a substrate and the recessed portions of the lighting apparatus in the embodiment.
Figure 19:
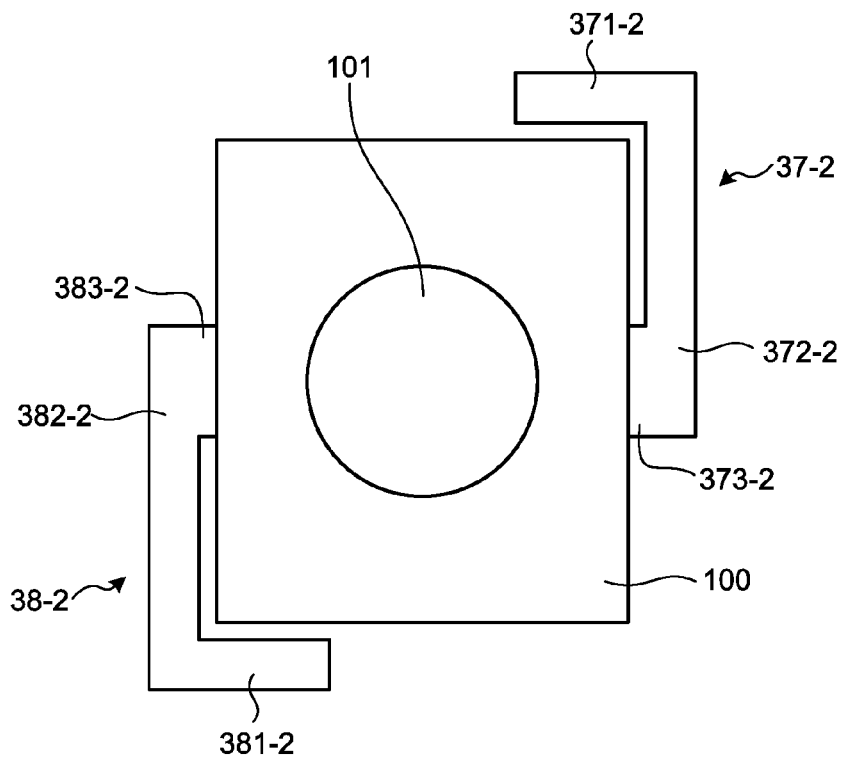
FIG. 19 is a schematic diagram illustrating another relation between the substrate and the recessed portions of the lighting apparatus.
Figure 20:
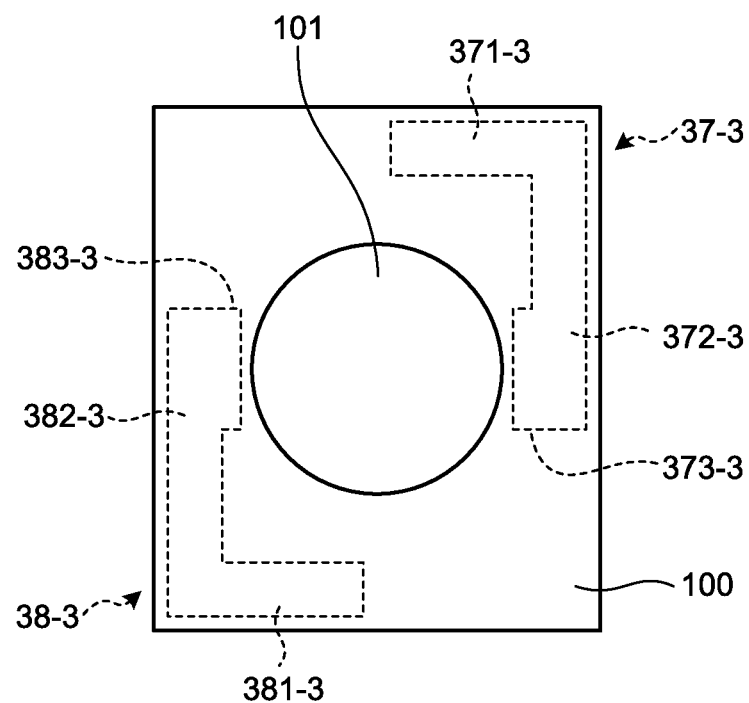
FIG. 20 is a schematic diagram illustrating yet another relation between the substrate and the recessed portions of the lighting apparatus.

The following describes, with reference to FIGS. 18 to 20, the relation between the substrate 100 on which the light emitting element 101 serving as an electronic component is arranged, and the grooves 37 and 38 serving as the recessed portions. FIG. 18 is a schematic diagram illustrating the relation between the substrate and the recessed portions of the lighting apparatus in the embodiment. In FIG. 18, the following describes each of the constituents of the grooves 37 and 38 by appending "−1" at the end of the reference signs of the respective constituents.

In the example illustrated in FIG. 18, in planar view of the mounting surface 36, the substrate 100 on which the light emitting element 101 serving as an electronic component is arranged is mounted on the mounting surface 36 such that a part of the circumferential end portion of the substrate 100 overlaps grooves 37-1 and 38-1 and such that a part of the grooves 37-1 and 38-1 is exposed. For example, in planar view of the mounting surface 36, the substrate 100 is mounted on the mounting surface 36 such that a part of the circumferential end portion of the substrate 100 overlaps the groove 37-1 and such that a part of the extending portions 371-1 and 372-1 is exposed. Furthermore, for example, in planar view of the mounting surface 36, the substrate 100 is mounted on the mounting surface 36 such that a part of the circumferential end portion of the substrate 100 overlaps the groove 38-1 and such that a part of the extending portions 381-1 and 382-1 is exposed.

The relation between the substrate 100 and the grooves 37 and 38 is not limited to the relation like illustrated in FIG. 18, and may be various types of relations depending on the sizes of the light emitting element 101 and the substrate 100, the locations of the grooves 37 and 38, and others. For example, the relation between the substrate 100 and the grooves 37 and 38 may be the relation like illustrated in FIG. 19. FIG. 19 is a schematic diagram illustrating another relation between the substrate and the recessed portions of the lighting apparatus. In FIG. 19, the following describes each of the constituents of the grooves 37 and 38 by appending "−2" at the end of the reference signs of the respective constituents.

In the example illustrated in FIG. 19, in planar view of the mounting surface 36, the substrate 100 on which the light emitting element 101 serving as an electronic component is arranged is mounted on the mounting surface 36 such that a part of the circumferential end portion of the substrate 100 is in close proximity to grooves 37-2 and 38-2 and such that an entirety of the grooves 37-2 and 38-2 is exposed. For example, in planar view of the mounting surface 36, the substrate 100 is mounted on the mounting surface 36 such that a part of the circumferential end portion of the substrate 100 substantially overlaps one side (left side in FIG. 19) of the end portion 373-2 of the groove 37-2 and such that an entirety of the extending portion 37-2 is exposed. Furthermore, for example, in planar view of the mounting surface 36, the substrate 100 is mounted on the mounting surface 36 such that a part of the circumferential end portion of the substrate 100 substantially overlaps one side (right side in FIG. 19) of the end portion 383-2 of the groove 38-2 and such that an entirety of the extending portion 38-2 is exposed. In the example in FIG. 19, illustrated has been a case that a part of the circumferential end portion of the substrate 100 substantially overlaps the one side of the end portion 373-2 of the groove 37-2, in planar view of the mounting surface 36. However, a part of the circumferential end portion of the substrate 100 only needs to be in close proximity to the one side of the end portion 373-2 of the groove 37-2 even when a part of the circumferential end portion of the substrate 100 does not overlap the one side of the end portion 373-2 of the groove 37-2. Similarly, illustrated has been a case that a part of the circumferential end portion of the substrate 100 substantially overlaps the one side of the end portion 383-2 of the groove 38-2, in planar view of the mounting surface 36. However, a part of the circumferential end portion of the substrate 100 only needs to be in close proximity to the one side of the end portion 383-2 of the groove 38-2 even when a part of the circumferential end portion of the substrate 100 does not overlap the one side of the end portion 383-2 of the groove 38-2.

Furthermore, for example, the relation between the substrate 100 and the grooves 37 and 38 may be the relation like illustrated in FIG. 20. FIG. 20 is a schematic diagram illustrating another relation between the substrate and the recessed portions of the lighting apparatus. In FIG. 20, the following describes each of the constituents of the grooves 37 and 38 by appending "−3" at the end of the reference signs of the respective constituents.

In the example illustrated in FIG. 20, in planar view of the mounting surface 36, the substrate 100 on which the light emitting element 101 serving as an electronic component is arranged is mounted on the mounting surface 36 such that a part of the circumferential end portion of the substrate 100 overlaps an entirety of grooves 37-3 and 38-3. That is, in the example illustrated in FIG. 20, in planar view of the mounting surface 36, with the substrate 100 being mounted on the mounting surface 36, the entirety of the grooves 37-3 and 38-3 overlaps a part of the circumferential end portion of the substrate 100. For example, in planar view of the mounting surface 36, the substrate 100 is mounted on the mounting surface 36 such that a part of the circumferential end portion of the substrate 100 overlaps the entirety of the groove 37-3 that is the extending portions 371-3 and 372-3 and the end portion 373-3. Furthermore, for example, in planar view of the mounting surface 36, the substrate 100 is mounted on the mounting surface 36 such that a part of the circumferential end portion of the substrate 100 overlaps the entirety of the groove 38-3 that is the extending portions 381-3 and 382-3 and the end portion 383-3.

Figure 21:
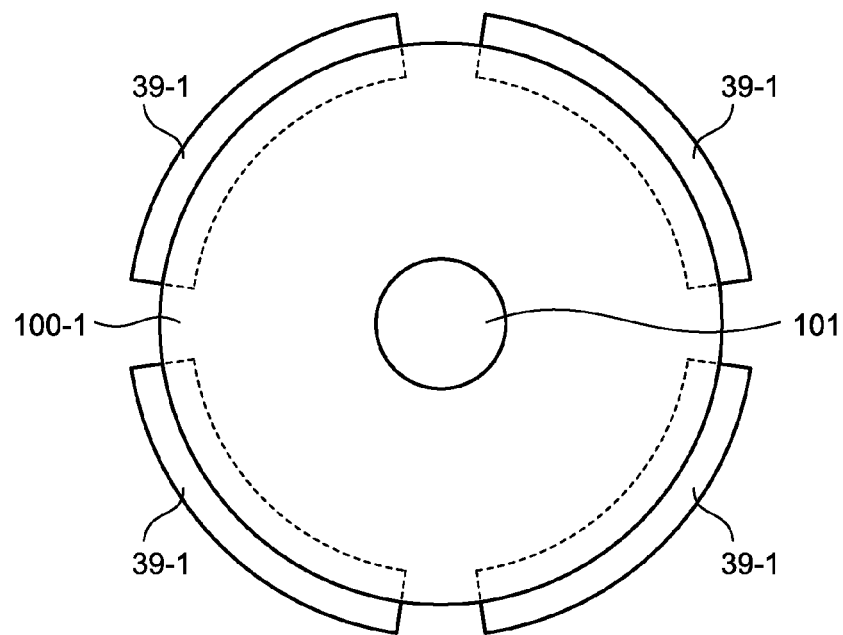
FIG. 21 is a schematic diagram illustrating the relation between another substrate and recessed portions.
Figure 22:
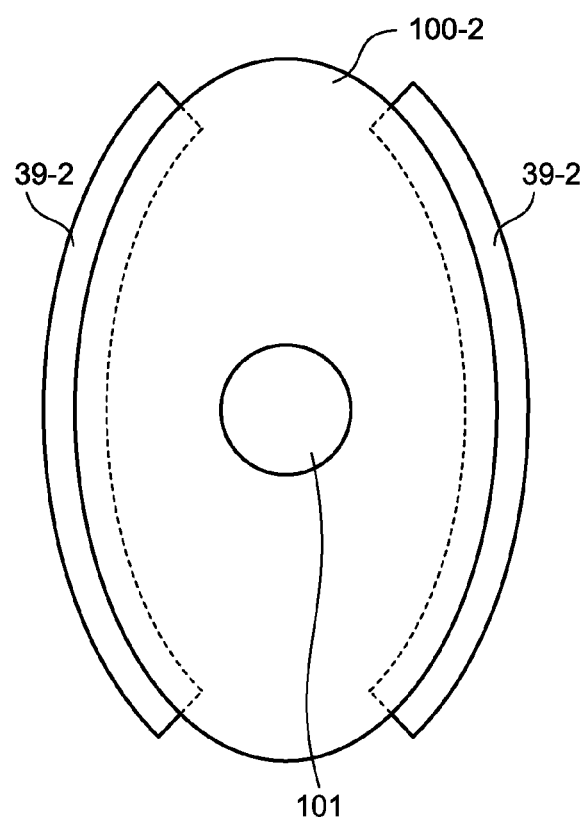
FIG. 22 is a schematic diagram illustrating the relation between yet another substrate and recessed portions.

As in the foregoing, the shape of the outer circumference of the substrate 100 in planar view of the mounting surface 36 of the base portion 35 is not limited to a rectangular shape, and it may be in a shape in which a side having the circumferential end includes a curve line such as a circle and an ellipse. Furthermore, corresponding to the shape of the outer circumference of the substrate 100, the grooves that are the recessed portions on the mounting surface 36 may have an appropriate shape. This point will be explained with reference to FIGS. 21 and 22. FIGS. 21 and 22 are schematic diagrams illustrating the relation between another substrate and recessed portions. Specifically, FIG. 21 is a schematic diagram illustrating the relation between a substrate 100-1 for which the shape of the outer circumference in planar view of the mounting surface 36 of the base portion 35 is a circle and grooves 39-1 that are the recessed portions. Furthermore, specifically, FIG. 22 is a schematic diagram illustrating the relation between a substrate 100-2 for which the shape of the outer circumference in planar view of the mounting surface 36 of the base portion 35 is an ellipse and grooves 39-2 that are the recessed portions.

For example, as illustrated in FIG. 21, when the shape of the outer circumference of the substrate 100-1 in planar view of the mounting surface 36 of the base portion 35 is a circle, four grooves 39-1 may be formed such that a part of the circumferential end portion of the substrate 100-1 overlaps the four grooves 39-1. In the example illustrated in FIG. 21, the four grooves 39-1 are provided along the circumferential direction of the outer circumference of the substrate 100-1 at equal intervals. For example, in planar view of the mounting surface 36, the substrate 100-1 is mounted on the mounting surface 36 such that a part of the circumferential end portion of the substrate 100-1 overlaps a part of the grooves 39-1 and such that a part of the grooves 39-1 is exposed. The grooves 39-1, as long as provided at equal intervals, may be two or three, or may be five or more.

Furthermore, for example, as illustrated in FIG. 22, when the shape of the outer circumference of the substrate 100-2 in planar view of the mounting surface 36 of the base portion 35 is an ellipse, two grooves 39-2 may be formed such that a part of the circumferential end portion of the substrate 100-2 overlaps the two grooves 39-2. In the example illustrated in FIG. 22, the two grooves 39-2 are provided along the circumferential direction of the outer circumference of the substrate 100-2 at equal intervals. For example, the two grooves 39-2 are provided at positions with the major axis of the substrate 100-2 interposed therebetween. For example, in planar view of the mounting surface 36, the substrate 100-2 is mounted on the mounting surface 36 such that a part of the circumferential end portion of the substrate 100-2 overlaps a part of the grooves 39-2 and such that a part of the grooves 39-2 is exposed.

As in the foregoing, the lighting apparatus 1 can rotate the arm portion 20 in the horizontal direction, and thus can rotate the irradiation direction (irradiation axis) in the horizontal direction with an inclined angle thereof maintained with respect to the vertical line. The rotational operation of the arm portion 20 in the horizontal direction by the first motor 42 and the rotation operation of the light source unit 30 in the vertical direction by the second motor 56 have been described individually. However, by the operation of a remote controller by the operator, a controller can control the first motor 42 and the second motor 56. For example, the lighting apparatus 1 is capable of simultaneously performing the rotational operation of the arm portion 20 in the horizontal direction and the rotational operation of the light source unit 30 in the vertical direction.

According to the present embodiment, the lighting apparatus 1 is configured by arranging in the first rotating portion 40 the first motor 42 to rotatively drive the arm portion 20 in the horizontal direction, and in the reinforced portion 50 the second motor 56 to rotatively drive the light source unit 30 in the vertical direction.

The present invention is not intended to be limited by the above-described embodiment. The invention includes ones that are configured by appropriately combining the above-described respective constituents. Further effects and modifications can be readily derived by those skilled in the art. Accordingly, a more extensive form of the invention is not limited to the above-described embodiment and various modifications are possible.

For example, it can be configured as follows. By installing a plurality of lighting apparatuses 1 on a ceiling and connecting the respective lighting apparatuses 1 via a wireless communication, a controller can be configured so as to simultaneously perform remote operations on the lighting apparatuses 1 with a single remote controller. The controller is not limited to the remote operation by the wireless communication, and for example, an operating unit that is operated by the operator and the lighting apparatuses 1 may be connected via a wired connection.

In the present embodiment, the lighting apparatus 1 of a ceiling-mounting type has been exemplified. However, it can be applied to a wall-mounting type. For the first motor 42 and the second motor 56, it is not limited to a stepping motor; and a DC motor, a DC brushless motor, an AC motor, and others can be applied. In this case also, when the rotation angle (amount of angular displacement) of the arm portion 20 in the horizontal direction and the rotation angle (amount of angular displacement) of the light source unit 30 in the vertical direction match or are made equivalent, the current control by the controller can be simplified. The light source is not limited to a light emitting element such as an LED, and it may be other light source such as a krypton bulb, for example.

According to one aspect of the present invention, it makes it possible to appropriately mount an electronic component on equipment.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electronic device comprising:
   an electronic component; and
   equipment that includes a mounting surface on which the electronic component is mounted via a coating agent and on which a recessed portion is provided along a part of a circumferential end portion of the electronic component and is not arranged in another part of the circumferential end portion of the electronic component.

2. The electronic device according to claim 1, wherein the electronic component is mounted on the mounting surface, in planar view of the mounting surface, such that a part of the circumferential end portion of the electronic component overlaps the recessed portion and such that a part of the recessed portion is exposed.

3. The electronic device according to claim 1, wherein the electronic component is mounted on the mounting surface, in planar view of the mounting surface, such that a part of the circumferential end portion of the electronic component is in close proximity to the recessed portion and such that an entirety of the recessed portion is exposed.

4. The electronic device according to claim 1, wherein the electronic component is mounted on the mounting surface, in planar view of the mounting surface, such that a part of the circumferential end portion of the electronic component overlaps an entirety of the recessed portion.

5. The electronic device according to claim 1, wherein the recessed portion, in planar view of the mounting surface, is made to be point-symmetric with respect to a center of the electronic component.

6. The electronic device according to claim 1, wherein
   the recessed portion includes a plurality of grooves, and
   the plurality of grooves are provided along the circumferential end portion of the electronic component.

7. The electronic device according to claim 6, wherein
   the electronic component has an outer circumference having a rectangular shape in planar view of the mounting surface, and
   the plurality of grooves include extending portions that extend from a corner of the electronic component in planar view of the mounting surface along two respective sides forming the corner.

8. The electronic device according to claim 7, wherein an end portion of an extending portion out of the extending portions is larger in width as compared with other portions, the extending portion extending along a longitudinal direction of the electronic component in planar view of the mounting surface.

9. The electronic device according to claim 6, wherein
the electronic component has an outer circumference that is circle in planar view of the mounting surface, and
the plurality of grooves are made at equal intervals along the outer circumference of the electronic component in planar view of the mounting surface.

10. The electronic device according to claim 6, wherein
the electronic component has an outer circumference that is in an ellipse in planar view of the mounting surface, and
the plurality of grooves are two grooves and are made at equal intervals along the outer circumference of the electronic component in planar view of the mounting surface.

11. The electronic device according to claim 1, wherein the recessed portion is provided in an area of the mounting surface that overlaps a portion other than a center of the electronic component in planar view of the mounting surface.

12. The electronic device according to claim 1, wherein the electronic component is a light emitting element, and the equipment is a heat sink.

13. A lighting apparatus comprising the electronic device according to claim 1.

* * * * *